United States Patent [19]

Akamine et al.

[11] Patent Number: 5,753,530
[45] Date of Patent: May 19, 1998

[54] IMPURITY DOPING METHOD WITH DIFFUSION SOURCE OF BORON-SILICIDE FILM

[75] Inventors: Tadao Akamine; Naoto Saito; Kenji Aoki; Yoshikazu Kojima, all of Tokyo, Japan

[73] Assignee: Seiko Instruments, Inc., Chiba, Japan

[21] Appl. No.: 449,655

[22] Filed: May 24, 1995

Related U.S. Application Data

[63] Continuation of Ser. No. 49,789, Apr. 21, 1993, abandoned.

[30] Foreign Application Priority Data

Apr. 21, 1992 [JP] Japan ..................... 4-129537
Feb. 25, 1993 [JP] Japan ..................... 5-060865

[51] Int. Cl.$^6$ ........................... H01C 21/385
[52] U.S. Cl. ........................... 437/160; 437/950
[58] Field of Search ........................... 437/160, 161, 437/950, 40, 913, 64; 156/626

[56] References Cited

U.S. PATENT DOCUMENTS

| | | | |
|---|---|---|---|
| 3,338,697 | 8/1967 | Aoki et al. ................. | 437/161 |
| 4,242,691 | 12/1980 | Kotani et al. . | |
| 4,395,433 | 7/1983 | Nagakubo et al. . | |
| 4,441,932 | 4/1984 | Akasaka et al. . | |
| 4,737,471 | 4/1988 | Shirato et al. . | |
| 4,778,774 | 10/1988 | Blossfeld ................. | 437/162 |
| 4,791,074 | 12/1988 | Tsunashima et al. ................. | 437/160 |
| 4,861,729 | 8/1989 | Fuse et al. . | |
| 4,935,386 | 6/1990 | Nakagawa et al. ................. | 437/160 |
| 5,032,532 | 7/1991 | Mori et al. ................. | 437/160 |
| 5,086,016 | 2/1992 | Brodsky et al. ................. | 437/160 |
| 5,124,272 | 6/1992 | Saito et al. ................. | 437/44 |
| 5,162,263 | 11/1992 | Kunishima ................. | 437/160 |
| 5,171,708 | 12/1992 | Kakayama et al. ................. | 437/160 |
| 5,179,034 | 1/1993 | Mori et al. ................. | 437/160 |
| 5,220,405 | 6/1993 | Barbee et al. ................. | 156/626 |
| 5,366,922 | 11/1994 | Aoki et al. ................. | 437/160 |

FOREIGN PATENT DOCUMENTS

| | | | |
|---|---|---|---|
| 91-059265 | 7/1989 | European Pat. Off. ............... | 437/160 |
| 91-165817 | 12/1989 | European Pat. Off. ............... | 437/160 |
| 60-92610 | 5/1985 | Japan ................. | 437/160 |
| 61-225851 | 7/1986 | Japan ................. | 437/162 |
| 62-271475 | 11/1987 | Japan . | |
| 63-166220 | 7/1988 | Japan . | |
| 63-237410 | 10/1988 | Japan ................. | 437/950 |
| 2-66938 | 3/1990 | Japan ................. | 437/160 |

*Primary Examiner*—John Niebling
*Assistant Examiner*—S. Mulpuri
*Attorney, Agent, or Firm*—Loeb & Loeb LLP

[57] ABSTRACT

A solid phase diffusion process using boron silicide film as diffusion source to improve controllability of diffusion of boron impurity into a silicon substrate in order to achieve a shallow junction. The process includes: cleaning the surface of a Si substrate by removing the native oxide film thereof to expose an active surface; treating the active surface to form thereon a boron silicide film as an impurity source; and introducing boron impurity from the boron silicide film into the Si substrate to form a boron diffusion layer. In this manner, a boron diffusion layer having a high surface concentration and a shallow junction can be formed because the boron silicide film is formed directly on the surface of the Si substrate. Because the boron silicide film is chemically and physically stable, an improved diffusion controllability is obtained. The diffusion controllability is further improved by accurately evaluating the impurity film optically during the fabrication process. A structure composed of a boron diffusion layer and a boron silicide region provides a high speed, highly integrated, and highly reliable semiconductor device, particularly when the boron silicide region is disposed between an impurity region and an electrode metal.

1 Claim, 30 Drawing Sheets

AS GROWN

AFTER OXIDATION $72.9 \Omega/\square \quad \sigma s/\bar{\rho}s = 4.2\%$ $80.1 \Omega/\square \quad \sigma s/\bar{\rho}s = 9.7\%$

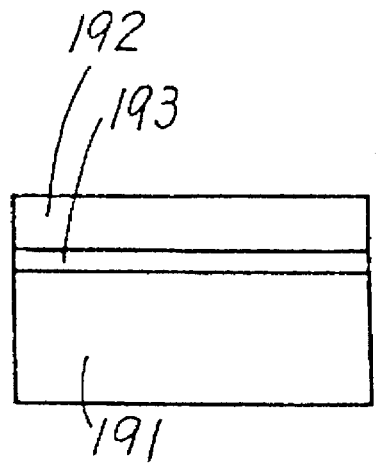
FIG. 24A
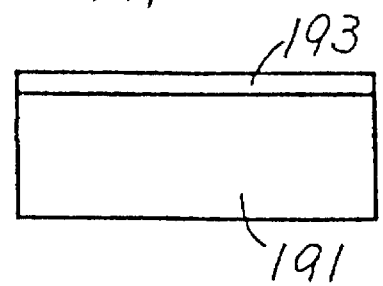
FIG. 24B
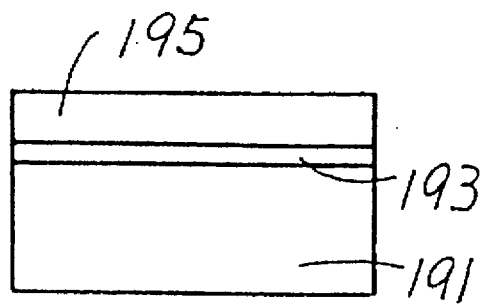
FIG. 24B1
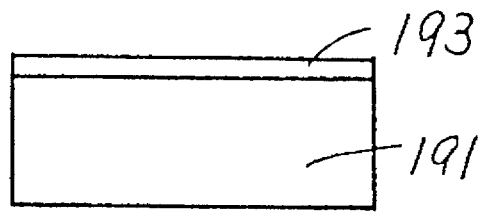
FIG. 24B2
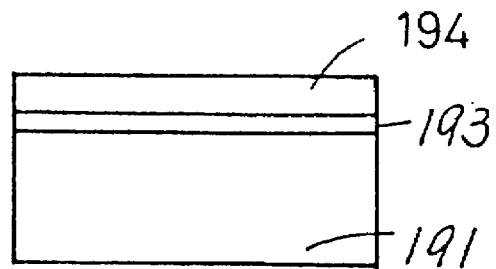
FIG. 24C

FIG. 31
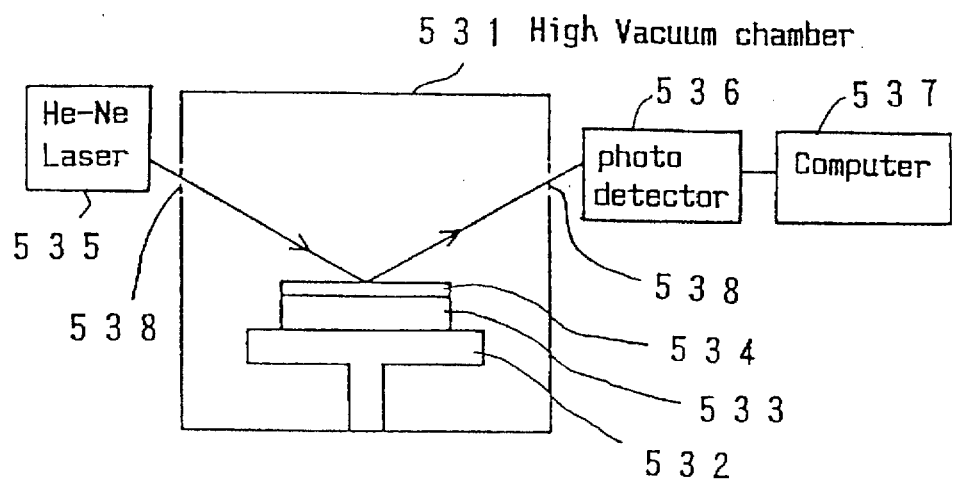
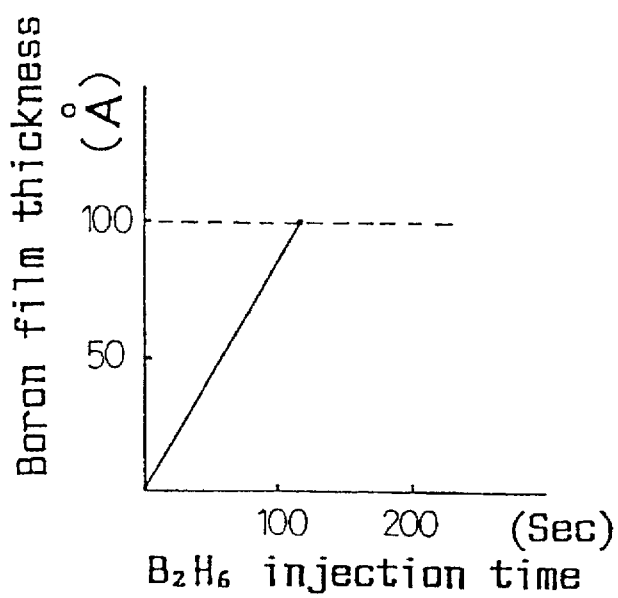
FIG. 32(a)
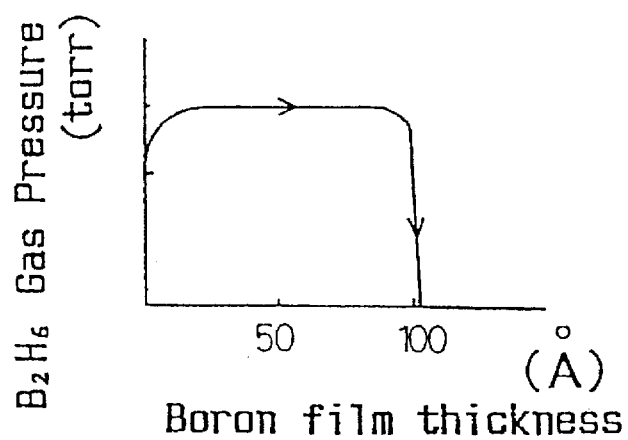
FIG. 32(b)

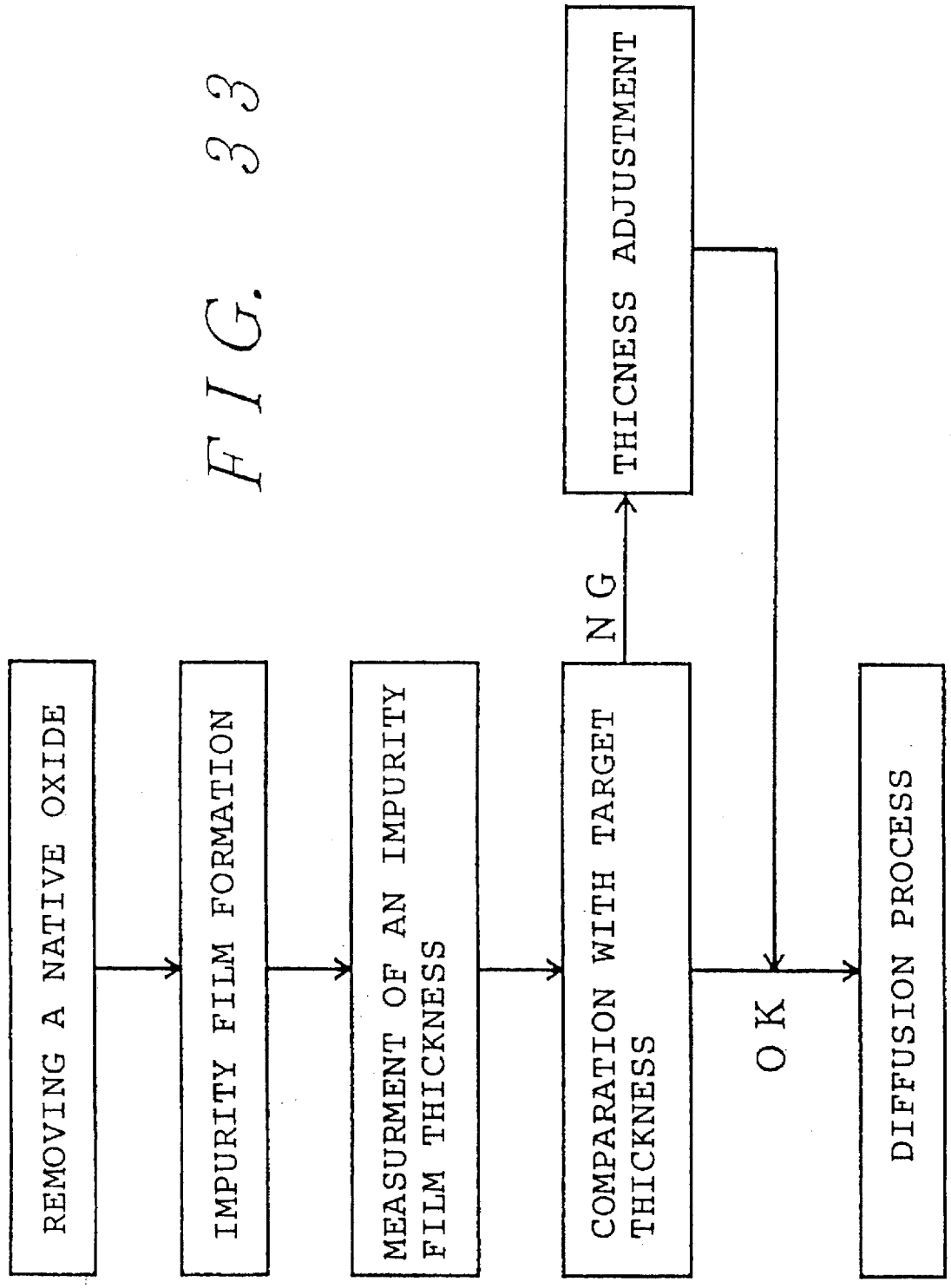

IMPURITY DOPING METHOD WITH DIFFUSION SOURCE OF BORON-SILICIDE FILM

This is a continuation of application Ser. No. 08/049,789 filed on Apr. 21, 1993, now abandoned.

BACKGROUND OF THE INVENTION

The present invention relates to a process for fabricating semiconductor devices, for example bipolar transistors and insulated gate field effect transistors, which are utilized in electronic systems such as computers, and it specifically relates to a process for fabricating a thin film for use as an impurity diffusion source and to a process for diffusing impurities for establishing a region having a desired electric conductive type and conductivity. More particularly, the present invention relates to a process for diffusing boron which functions as an acceptor inside a semiconductor layer and for fabricating a boron silicide film which functions as an impurity film.

The present invention also relates to a method for evaluating an impurity diffusion film for use in the step of impurity diffusion in fabricating semiconductor devices, and to an apparatus which is equipped to implement such evaluation method and is used for fabricating semiconductors for the impurity film.

The present invention further relates to semiconductor device structures represented by bipolar transistors or insulated gate field effect transistors which are used in computers and the like. More particularly, it relates to the structures of active regions, control electrodes, and contact regions of such semiconductor devices.

Conventional technologies for introducing an elemental impurity in semiconductor devices include the well known ion implantation method. The method comprises directly bombarding the surface of a silicon substrate with accelerated ions, and then thermally treating the silicon substrate to allow the implanted ions to diffuse. However, the ion implantation process has limitations relating to reducing the thickness of the diffusion layer because a shallow diffusion layer is difficult to produce due to the so-called channeling effect even when the accelerating voltage is lowered. The channeling effect is more clearly observed when the impurity is boron, as compared with phosphorus and arsenic, and is therefore an obstacle which cannot be neglected in forming a P type impurity layer. With increasing demand for smaller semiconductor elements, shallower impurity layers are required in the silicon substrate. However, the ion implantation process which is widely used at present cannot satisfy such demands.

Solid phase diffusion is another known technology for introducing impurities into a silicon substrate. Because this process is closely related with that of the present invention, it is described briefly below with reference to FIG. 2.

In FIG. 2, step A comprises preparing a silicon substrate 21, whose surface is generally covered with an oxide film 22. In the subsequent step B, a glass film containing boron as an impurity, e.g. a borosilicate glass (BSG) film 23, is formed on the surface of the substrate. This so-called step of pre-depositing the BSG film 23 can be carried out, for example, by thermally oxidizing the surface of the substrate 21 in a processing atmosphere containing boron.

The final step C comprises forming a boron diffusion layer 26 in substrate 21 by a heat treatment. This solid phase diffusion process using an impurity-containing glass such as a BSG film as the diffusion source, however, has drawbacks as follows. The diffusion coefficient of the commonly used P type impurity boron is lower than that of the silicon substrate by two orders of magnitude ($10^2$) or more. Thus, the diffusion of the impurities into the glass becomes the rate controlling factor in the solid phase diffusion process. This requires the heat treatment to be carried out at a high temperature of 1,000° C. or higher to assure sufficient incorporation of the impurities into the silicon substrate. The impurity layer extends well inside the silicon layer as a result, and it becomes difficult to form a shallow junction.

In light of the aforementioned circumstances with the ion implantation process and solid diffusion process using an impurity glass, each having their respective disadvantages, another solid diffusion process using the impurity film itself as the diffusion source has been developed recently. For example, in U.S. Pat. No.4,791,074, which issued on Dec. 13, 1988, there is disclosed a process which comprises exposing the surface of the silicon substrate, depositing thereon a boron film, and thermally treating the resulting structure thereafter to allow boron to diffuse into the silicon substrate. The boron film in this process is formed by, for example, vapor phase deposition.

Such boron films were conventionally evaluated by depositing a boron film on the surface of a special use silicon substrate for monitoring the film thickness using a partially patterned oxide film as the mask, then selectively removing the mask therefrom, and scanning the surface of the deposited film to measure the height difference of the film.

Furthermore, conventional apparatuses for fabricating semiconductor devices utilized ion implantation processes for establishing the active region, i.e. the region doped with impurities. It then follows that the impurity region is formed in a Gaussian distribution, and that the concentration of the impurities on the surface exhibit a distribution not higher than the limit of solid solubility of boron for silicon. As mentioned in the foregoing, the conventional ion implantation processes have limitations with respect to controlling the depth of the impurity layer.

Another impurity doping process, i.e. solid phase diffusion using the impurity film itself as the diffusion source, in principle has no limits on the depth of the impurity layer. However, the above solid phase diffusion process using the impurity film itself as the diffusion source suffers drawbacks as follows. Impurity films such as a boron film which are deposited on the exposed active face of a silicon substrate do not always have a structure which is chemically and physically stable. Those structures are influenced by the thermal and chemical treatments which are incorporated in the semiconductor fabrication process to cause the amount of film deposition and the like to greatly fluctuate. The impurity concentration profile along the depth direction cannot be established with high precision as long as there are problems concerning the stability and controllability of the impurity film.

In the impurity-doping process using a boron or boron silicide film as the diffusion layer, however, a complicated process for evaluating the impurity film was necessary. The conventional method for evaluating the thickness of the boron film, which was based on a mechanical means, was not capable of measuring thin films as thin as 100 Å or less in thickness with a sufficiently high precision. Moreover, the evaluation was conducted by bringing a probe into contact with the surface in which the boron film produced flaws. Then, it happens that the wafer should be used specifically for monitoring the film thickness and not for practical production. Still further, the monitor wafer for this specific usage is not a simple one, but is required to be prepared into a complicated structure prior to evaluation. It can be seen therefore that an impurity diffusion process using a boron film cannot be readily introduced into a practical production line.

The process for fabricating a semiconductor device by ion implantation is insufficient in satisfying the requirement of forming a shallow junction for realizing smaller semiconductor devices due to the well known problems of, for example, damage and channeling in the silicon substrate. As long as an ion implantation process is utilized, the structural features of the semiconductor device should reflect the aforementioned problems.

SUMMARY OF THE INVENTION

It is an object of the present invention to overcome the problems enumerated hereinbefore.

A more specific object of the present invention is to provide a semiconductor device having an extremely shallow impurity region and a process for fabricating the same.

Another object of the present invention is to provide a semiconductor device having an impurity film which is less influenced by thermal and chemical treatments, and a process for fabricating the same.

A further object of the present invention is to provide a semiconductor device having low resistance between a metal connection structure and the shallow impurity region, and a process for fabricating the same.

A still further object of the present invention is to provide a high-density integrated semiconductor device capable of operating at a high speed, and a process for fabricating the same.

Yet another object of the present invention is to provide a semiconductor device having a highly concentrated impurity region, and a process for fabricating the same.

Another object of the present invention is to provide a method for evaluating, rapidly and with high precision, the film thickness of an impurity film of a semiconductor device having such impurity films.

A further object of the present invention is to provide an apparatus for fabricating semiconductors for use as impurity films, which is capable of fabricating very thin impurity films with excellent controllability.

In the light of the aforementioned problems of the conventional technology, another object of the present invention is to provides a process for conducting diffusion of impurities stably and with excellent controllability utilizing a diffusion source having a film structure that is highly resistant to chemical and physical treatments.

The objects of the present invention can be accomplished as follows. The impurity diffusion process according to the present invention comprises a cleaning step to expose an active surface of the silicon layer, a treatment step for forming a boron silicide layer (a chemical compound layer comprising the elemental impurity and silicon) as a reaction product of boron and silicon on the active surface. Further a diffusion step for introducing boron impurities into the silicon layer from the boron silicide layer may follow.

According to an embodiment of the present invention, the treatment step comprises a film deposition step of forming a deposition layer containing boron on the active surface, and a step of thermally reacting the deposition layer with the silicon layer to form therefrom the boron silicide layer. In conducting the step of thermal treatment, an additional step of selectively removing the deposition layer containing boron or of etching may be incorporated before the thermal treatment. In another embodiment of the present invention, a covering step of forming a cap film on the boron silicide layer may be included prior to the diffusion step.

Still another embodiment of the present invention involves a surface treatment step of selectively or wholly removing the boron silicide layer by etching before or after the diffusion step.

The present invention further provides a method for evaluating the film thickness of the impurity film which comprises irradiating light onto the boron film and analyzing the reflected light. Furthermore, the present invention provides an apparatus for fabricating an impurity film which also carries out the method for evaluating the thickness of the film in accordance with the present invention. Accordingly, the impurity diffusion process of the present invention comprises controlling the film thickness when an observed value deviates from a desired value, and then shifting to the diffusion step.

The semiconductor device according to the present invention also provides a layered structure of a boron silicide region and an impurity-doped semiconductor region. The depth of the impurity-doped semiconductor region formed by effecting solid phase diffusion can be shallower than the thickness of the boron silicide layer.

The process for fabricating a semiconductor according to the present invention comprises forming a boron silicide layer in direct contact with the surface of the silicon layer, and further optionally effecting solid phase diffusion using the boron silicide layer as the diffusion source. A boron diffusion layer having a desired concentration profile in the layer thickness direction can be obtained by controlling the composition of the boron silicide layer, the layer thickness, and the temperature and duration for the diffusion treatment. In particular, an ultra-thin impurity diffusion layer, indispensable for fabricating smaller semiconductor elements, can be formed by the use of the process. Because a boron silicide film is far more stable than boron films which were conventionally used as the diffusion sources, the process can be more easily controlled and the design for the process steps permits a greater freedom for diversification.

The boron silicide layer can be formed by, for example, once depositing a layer containing boron on the active surface of the silicon layer and then thermally reacting the deposited layer with the silicon layer. Unlike the boron silicide layer, the deposition layer containing boron is chemically or physically unstable so that it can be easily etched. Thus, an impurity diffusion region as desired can be obtained by selectively removing the deposition layer containing boron before conducting the thermal reaction step.

The process of solid phase diffusion using a boron silicide layer as the diffusion source may sometimes require the control of out-diffusion. This can be achieved by forming a cap film of a desired composition on boron silicide prior to the diffusion step. The boron silicide layer being utilized as the diffusion source may be omitted from the final device. However, it may be removed selectively with an aim to further reducing the resistance of the electric connections and the like. An etching process involving a particular surface treatment can be applied in such a case.

The method of evaluating the semiconductor device according to the present invention comprises evaluating the film thickness of a boron film or of a film of a boron-silicon compound using an optical means down to a thickness of 100 Å or less. Because this method is a non-contact method, the wafer on which the measurement is conducted can be used in commercial production of ICs. Furthermore, the evaluation can be carried out in real time during the impurity film deposition operation. The resistance of the diffusion layer which is formed after the diffusion step can be controlled with high precision because the diffusion is conducted on a thickness-controlled boron film.

The semiconductor device according to the present invention also comprises a layered structure of a semiconductor region and a boron silicide layer. By taking this structure, the semiconductor device of the present invention provides characteristics as follows.

Firstly, a semiconductor region doped with impurities at high concentration is produced without using an ion implantation process. This enables a semiconductor device free from influences of channeling and shadowing effects. Thus, a MISFET having excellent symmetry comprising shallow source/drain region junctions can be obtained, as well as bipolar transistors having ultra-thin base regions and impurity profiles with no emitter pushing effects.

Secondly, the boron silicide film itself functions as a barrier layer for suppressing the spike phenomenon of metal, for example at the contact regions. Furthermore, the semiconductor device having the aforementioned structure according to the present invention has advantages from the viewpoint of the fabrication process. Specifically, because a boron silicide film is far more stable than boron films which were conventionally used as the diffusion sources, the use of a boron silicide film not only facilitates the process control but also permits diversified process design. Furthermore, because the boron silicide film itself contains boron in a large amount, the migration problem of impurities from the semiconductor region to the connection can be solved by compensating for the boron being lost. More specifically, in a junction of a P+ semiconductor region with a tungsten silicide film, for example, boron is lost from the junction due to the absorption phenomenon which allows the boron atoms to migrate from the junction into the tungsten silicide layer. The boron silicide film of the present invention can effectively compensate for boron being lost.

BRIEF DESCRIPTION OF THE DRAWINGS

FIGS. 24 show process steps for a seventh embodiment of a process for fabricating a semiconductor device according to the present invention.

FIG. 31 is a pictorial diagram showing an apparatus for fabricating semiconductors according to the present invention.

FIG. 32(a) is a graph which relates the measured boron film thickness with the duration of introducing $B_2H_6$, and FIG. 32(b) is a graph which relates the pressure change in $B_2H_6$ gas with the film thickness of a boron film.

FIG. 33 is a flow chart showing an impurity doping process according to the present invention.

DESCRIPTION OF THE PREFERRED EMBODIMENTS

Referring to the attached Figures, preferred embodiments of the present invention are described in further detail below.

Figure 1A:
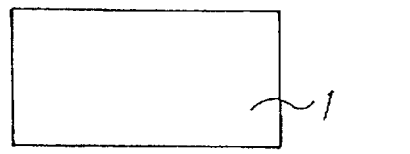
FIGS. 1 show successive process steps for a first embodiment of a process for fabricating a semiconductor device according to the present invention.
Figure 1B:
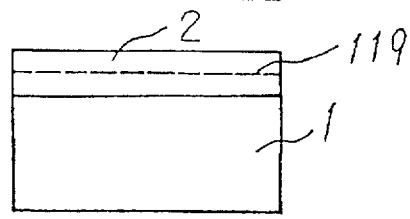
Figure 1C:
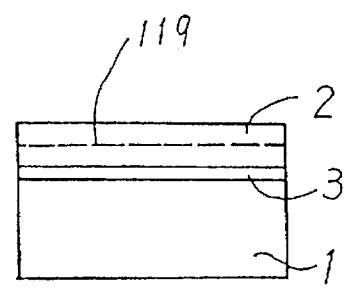
Figure 2A:
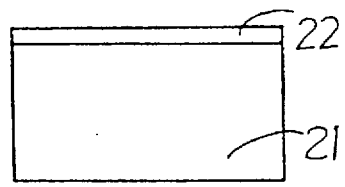
FIGS. 2 show conventional process steps for impurity diffusion.
Figure 2B:
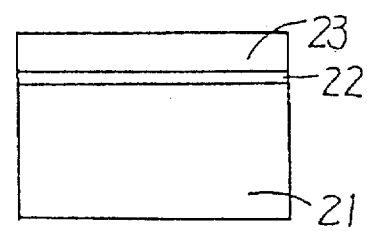
Figure 2C:
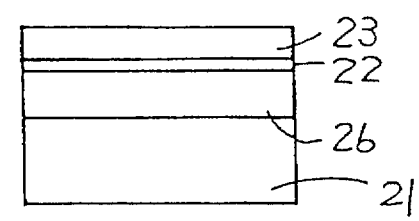

FIG. 1 shows the process steps of an impurity diffusion process according to a first embodiment of the present invention. In step A, an active surface of the silicon layer, i.e. of a silicon substrate 1, is exposed by cleaning. When the surface of silicon substrate 1 has thereon an oxide film and the like, a commonly used process of oxide film removal using hydrofluoric acid and the like is conducted followed by the removal of a native oxide film. More specifically, the native oxide film which covers the surface of the silicon substrate 1 is removed. This step is requisite, because a simple treatment using only hydrofluoric acid leads to an immediate formation of a native oxide film on exposure to air.

The step of removing the native oxide film comprises introducing hydrogen gas for a predetermined duration to the silicon substrate 1 which has been heated to, for example, 850° C. or higher inside a vacuum chamber having a background pressure of, for example, $1\times10^{-4}$ Pa or lower. The hydrogen gas in this process is introduced until the chamber attains an interior pressure of $1.3\times10^{-2}$ Pa. This process removes the native oxide film from the surface of the silicon layer to expose a chemically active silicon surface which can be maintained active for a relatively long duration. Otherwise, the native oxide film can be removed by etching with a dilute hydrofluoric acid or by argon sputtering in vacuum, however, such methods require an immediate advance to the subsequent step.

Figure 3:
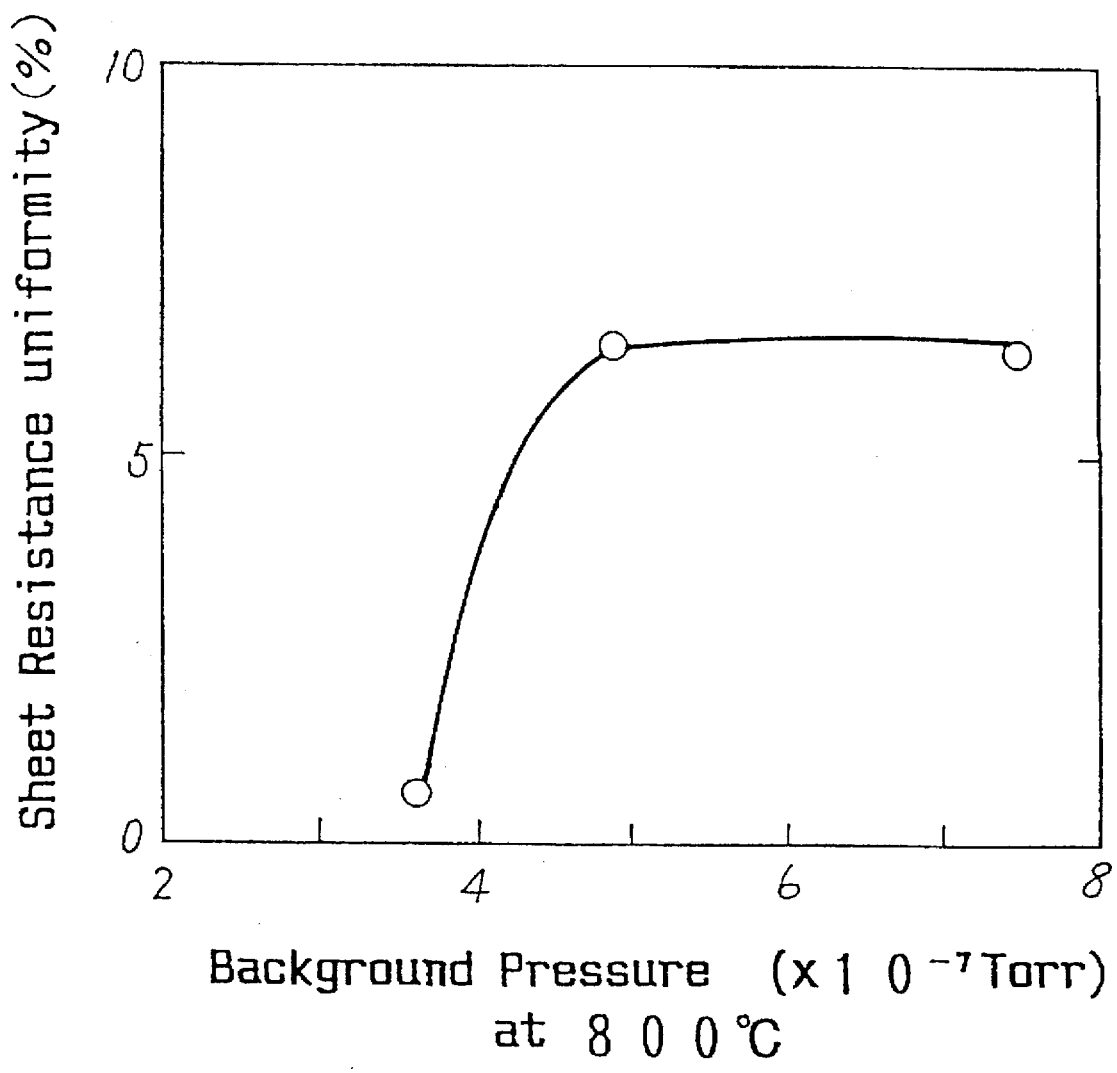
FIG. 3 is a graph which relates the fluctuation of an in-plane sheet resistance within a wafer to a base (background) degree of vacuum.

FIG. 3 is a graph which relates the fluctuation in sheet resistance of the diffusion layer after diffusion and completion of the device to the initial vacuum degree (where, 1 Torr=133 Pa) of the chamber in step A. The graph shows that the sheet resistance fluctuates considerably to 5% or higher with a vacuum degree of $5\times10^{-7}$ Torr. It can thus be seen that a clean silicon substrate cannot be obtained or maintained active if a sufficiently high degree of vacuum is not achieved.

The step B which follows the step A comprises forming a boron silicide film 2 on the active surface without removing substrate 1 from the vacuum chamber. In the present embodiment, the boron silicide film 2 is formed by a vapor phase thermal reaction between boron and silicon. More specifically, a process gas containing boron, e.g. diborane ($B_2H_6$) is introduced under a predetermined pressure inside the vacuum chamber while heating the silicon substrate 1 to a temperature higher than 600° C. In this manner, the process gas can be pyrolyzed to allow direct reaction of boron atoms or molecules containing boron with silicon atoms from substrate 1 to thereby form a boron-silicon compound, i.e. boron silicide. In the present invention, boron silicide refers to a compound containing 80% or more, atomic, of impurity boron and from 5 to 20%, atomic, of silicon. This reaction proceeds both upwardly and downwardly from the initial silicon surface 119. If the heat treatment were to be conducted at a temperature of 850° C. or higher and for a duration of several minutes or longer, boron atoms will be introduced into the silicon substrate 1 from the boron silicide layer 2 to form simultaneously a boron diffusion layer. Therefore, it is desirable that the temperature of the heat treatment to form a chemical compound layer be lower than 850° C. to prevent a significant number of boron atoms from diffusing into the silicon substrate.

Figure 4:
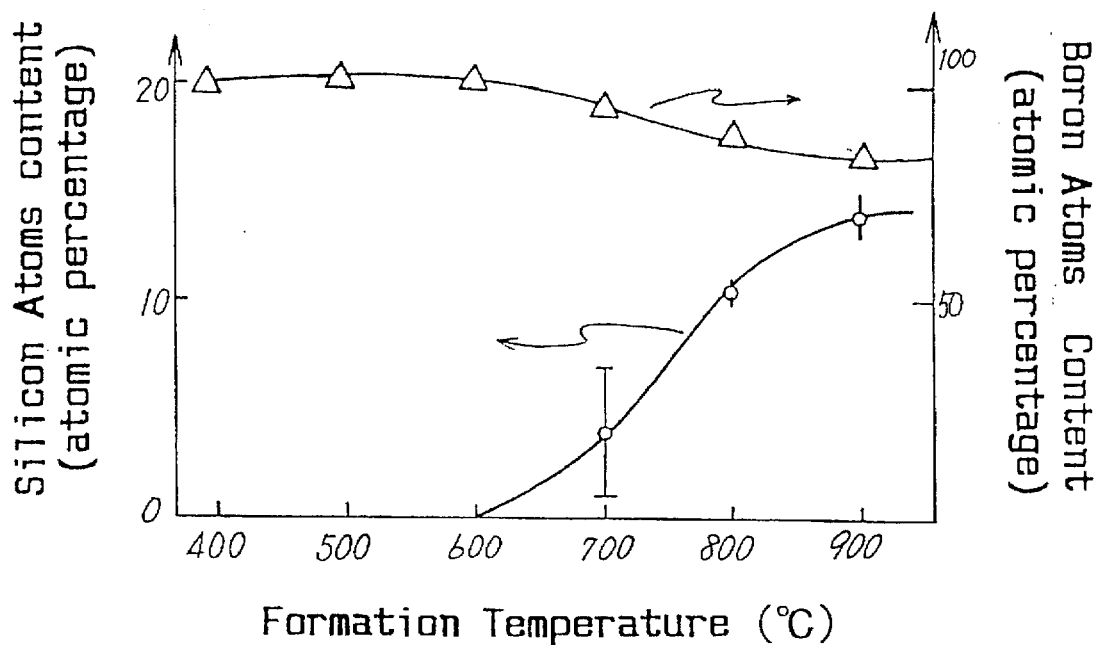
FIG. 4 is a graph showing a relation between film deposition temperature and the composition of boron silicide.

The composition of the boron silicide film thus obtained is shown in FIG. 4. The left hand ordinate of the graph shows the silicon content (% atomic), the right hand coordinate shows the boron content (% atomic), and the abscissa shows the temperature of the heated substrate, or the film deposition temperature. The curve formed from measurements designated by triangles indicates boron content, while the curve formed from measurements designated by circles indicates silicon content. Boron accounts for almost all of the composition except for silicon, as the oxygen content was found to be of the order of 1% or lower through the experiments of the present inventors. The graph shows a clear dependence of silicon content on the film deposition temperature, since silicon content increases with increased temperature to yield a saturated silicon content of 20% or less at 900° C. or higher. Thus, it can be seen therefrom that the boron content never decreases to less than 80%. This boron content is far larger than the solubility limit for boron atoms in forming solid solution with a silicon substrate. Since boron silicide requires silicon in an amount of 5% atomic or higher to establish a chemically and physically stable diffusion source, it can be seen from the graph of FIG. 4 that the film deposition should be conducted at a temperature higher than 600° C.

In step C as shown in FIG. 1, boron atoms are allowed to diffuse into the silicon substrate 1 from the boron silicide film 2 to establish the desired diffusion layer 3. The temperature for diffusion should be set higher than the temperature employed in step B.

Figure 5:
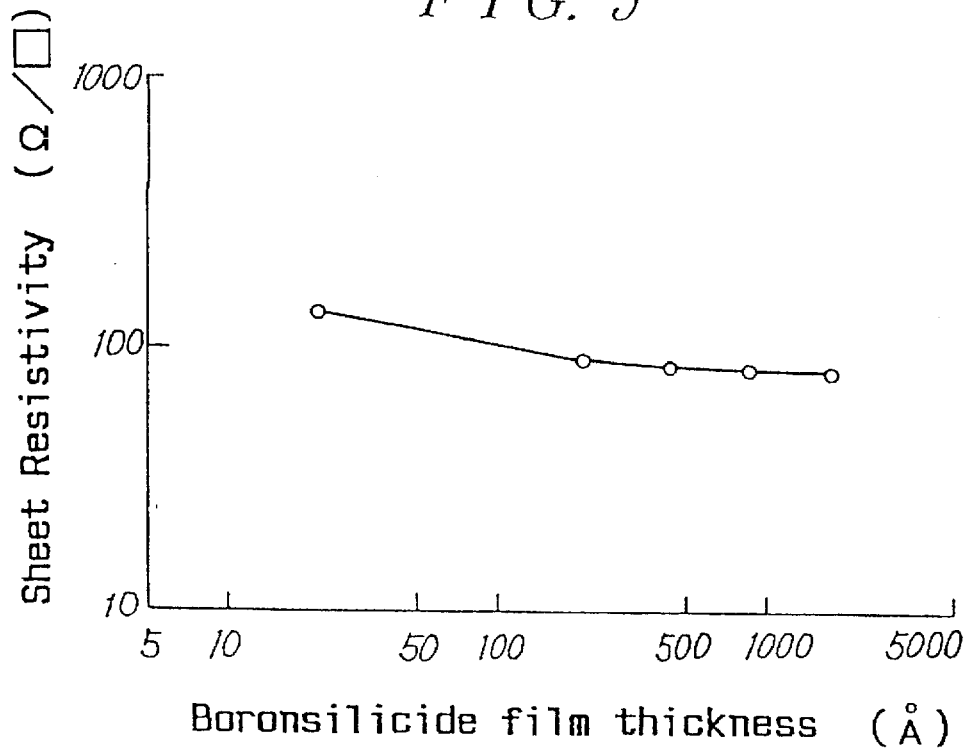
FIG. 5 is a graph showing a relation between the film thickness of a boron silicide film and the sheet resistance of the boron diffusion layer.

In FIG. 5 is plotted the observed resistance of the boron diffusion layer 3 on completion of step C as shown in the step sequence in FIG. 1. The ordinate of the graph is the sheet resistivity (Ω/sq) and the abscissa is the thickness (Å) of the boron silicide (SiB) film 2. The boron silicide used in this case was obtained by depositing at 900° C., and was subjected to the diffusion step also at 900° C. It can be seen from the graph of FIG. 5 that a stable sheet resistivity is obtained for an SiB film deposited to a thickness of 100 Å or more. A constant sheet resistivity is then obtained irrespective of the film thickness, and the fact that the sheet resistivity of the resulting diffusion layer remains the same with increasing thickness of the SiB film indicates that the diffusion concentration of boron is independent the thickness of the SiB film. Accordingly, uniform doping can be effected for SiB films 100 Å or thicker even if there may be some fluctuation in thickness above 100 Å.

The boron silicide film contains boron atoms in an amount not lower than the solubility limit for boron in silicon, because the atoms diffuse in excess of the solubility limit into the silicon substrate from the boron silicide film during diffusion. In addition, the diffusion constant for boron inside the boron silicide film should be sufficiently higher than that inside the silicon substrate. Accordingly, the silicon content of the boron silicide film cannot be excessively increased.

Figure 6:
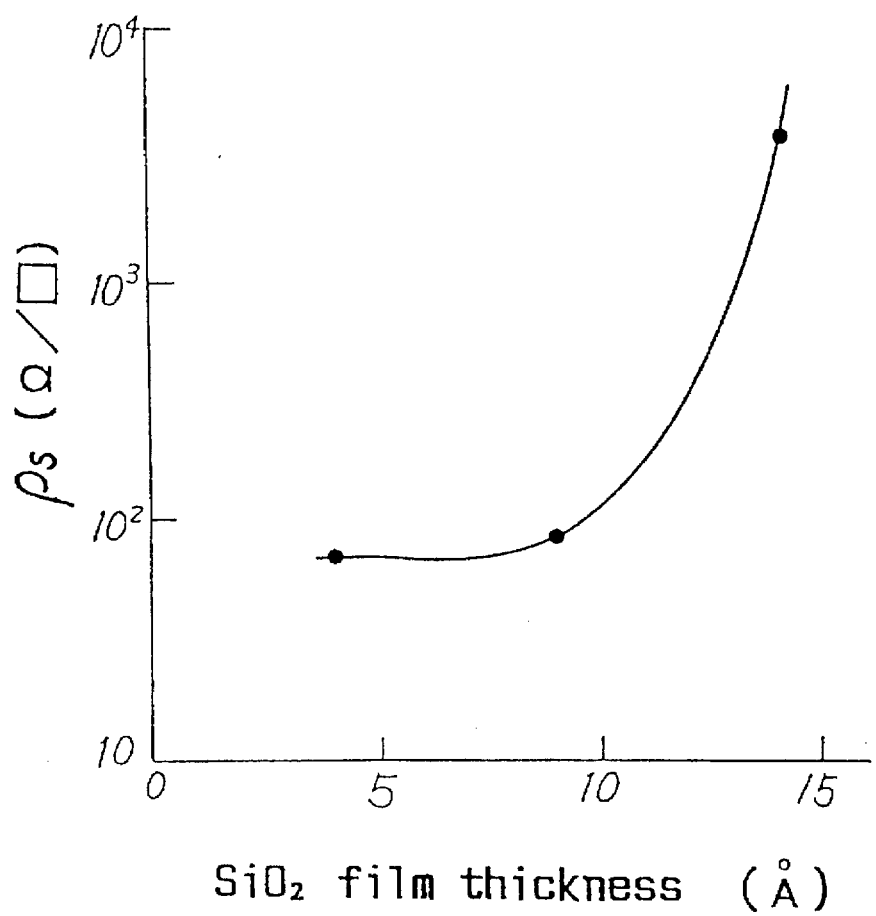
FIG. 6 relates a film thickness of native oxide film to the sheet resistance of a boron diffusion layer.

A cleaning step before establishing a boron silicide layer is requisite in the present invention for removing the native oxide film from the silicon substrate and thereby exposing an active surface. FIG. 6 clearly shows the effect of the cleaning step. The ordinate of the graph of FIG. 6 stands for the sheet resistivity $\rho_s$ of the boron diffusion layer, and the abscissa for the thickness of the $SiO_2$ native oxide film before subjecting the substrate to the cleaning step.

In the present case, a sample having been subjected to thermal diffusion treatment at 900° C. was used for the measurement.

It can be seen from the graph that a sheet resistivity of 100 Ω/sq or lower can be obtained by reducing the native oxide film down to a thickness of about 10 Å or less. This is evidence that the silicon from the substrate can be more easily reacted with the boron atoms from the gas phase to yield a boron silicide film. Furthermore, solid phase diffusion can be conducted sufficiently, because it occurs directly from the diffusion source, i.e. from the boron silicide layer, without incorporating any native oxide films. If the residual native oxide film has a thickness of 10 Å or more, on the other hand, the sheet resistivity of the boron diffusion layer rapidly increases, with the result that the impurity diffusion is not sufficiently achieved. That is, the presence of a native oxide film hinders formation of a stable boron silicide film. In other words, a boron silicide film can be formed selectively only on the regions having thereon native oxide films 10 Å or less in thickness. It can be seen from the foregoing that the step of cleaning the substrate plays an important role in the impurity diffusion process according to the present invention.

It is difficult to control the thickness of the native oxide film to be 10 Å or less with a simple treatment using hydrofluoric acid as in the conventional processes. Even at room temperature, an active surface of silicon is readily oxidized on exposure to air. Accordingly, the cleaning step according to the present invention constitutes a step of removing native oxide films and keeping the active surface free of a native oxide film to obtain, so far as the inventors have confirmed experimentally, films as thin as 10 Å or less, or a state completely devoid of oxide films.

Figure 7:
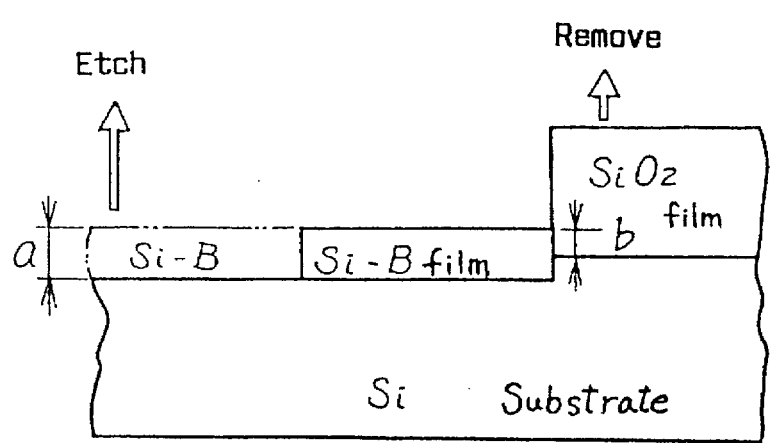
FIG. 7 is a schematic diagram showing the method for measuring the thickness of a boron silicide film according to the present invention.

Referring to FIG. 7, the mechanism of growth for the boron silicide film is described below. The thickness of the boron silicide film or SiB film is measured by an etching method or by a lift off method. The comparison of the thicknesses obtained by those differing two methods allows judgement of whether the film has formed by a deposition process or by a thermal reaction process. The etching method comprises partially masking the boron silicide film with an $SiO_2$ film by sputtering, then etching the boron silicide film by repeating treatments using nitric acid and hydrofluoric acid in turn, and then measuring the height difference a with a step meter. In the measurement, a sample having been prepared by heat treating the boron silicide film at 800° C. was used. On the other hand, the lift off method comprises forming the boron silicide film on a Si substrate having a part previously masked with an $SiO_2$ film, and then measuring the film thickness b with a step meter after removing the $SiO_2$ film masking.

However, in practical mass production, a simpler method for evaluating the film thickness is required. Such an evaluation method will be described hereinafter.

The observed results are summarized in Table 1, below. The measurement was conducted on two samples having boron silicide films obtained under differing conditions 1 and 2; condition 1 comprises introducing the process gas for 600 seconds for forming the boron silicide film, and condition 2 comprises introducing the gas for 1,000 seconds. Table 1 shows that the height difference b as measured by a lift off method under condition 1 is 37 Å, which is in clear contrast to the height difference a of 84 Å as obtained by an etching method. With respect to the measured results for the films obtained under condition 2, the height difference b of 65 Å is obtained by a lift off method in contrast with the height difference a of 140 Å obtained by an etching method. The etching method tends to yield larger results for the film thickness. It can be seen therefrom that silicon inside the boron silicide film is incorporated through the reaction of the process gas such as diborane with the silicon substrate, and that the boron silicide film is formed not by deposition but by thermal reaction between silicon and boron.

The boron silicide film is therefore effectively and selectively formed on the exposed surface of the silicon substrate according to this mechanism of formation. The boron silicide film cannot be obtained effectively on an oxide film, but a film containing oxygen, boron, and silicon each having a respective distribution with distance from the surface is formed instead. This film is believed to be an oxide film containing boron having diffusion from the surface thereof, and is therefore different from the film according to the present invention.

TABLE 1

| Method for Measuring | Measured Film Thickness (Å) | |
| --- | --- | --- |
| Height Difference | Condition 1 | Condition 2 |
| Lift Off method | 37 | 65 |
| Etching method | 84 | 140 |

Figure 8:
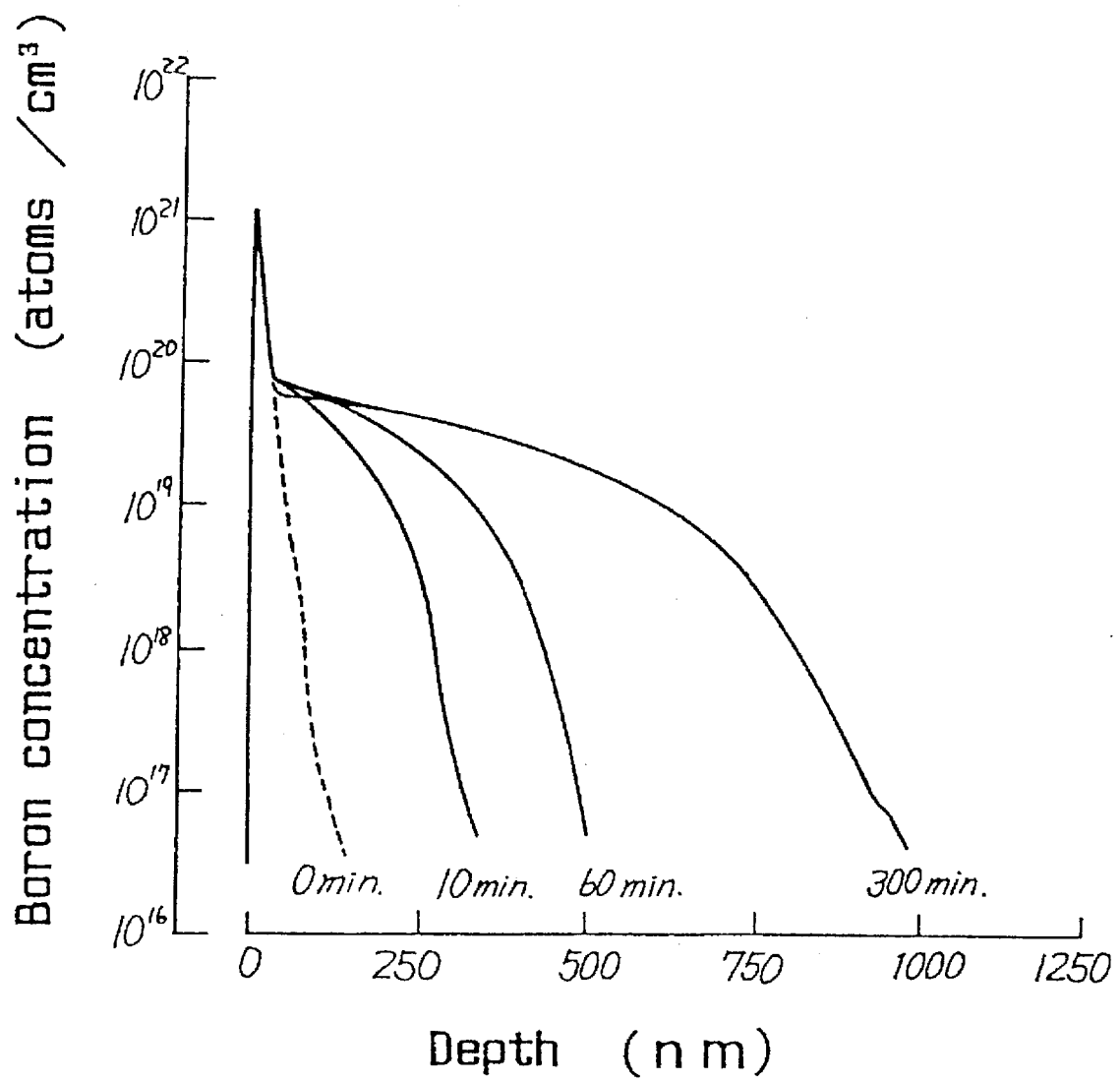
FIG. 8 is a graph showing a concentration profile for impurities of a boron diffusion layer.

Condition 1: Period of Gas Introduction 600 sec
Condition 2: Period of Gas Introduction 1,000 sec The depth profile of atomic boron concentration inside the boron diffusion layer is shown in the graph of FIG. 8. In this graph, the atomic boron concentration (atoms/cm$^3$) and the depth (nm) in the boron diffusion layer are taken as the ordinate and the abscissa, respectively. The concentration profile was obtained on samples having been subjected to thermal diffusion treatment at 900° C., with differing treatment durations, using SIMS (secondary ion mass spectroscopy). The boron diffusion layer becomes deeper with increasing duration of thermal treatment, whereas the boron concentration in the surface of the diffusion layer remains at a constant value of about $8 \times 10^{19}$ atoms/cm$^3$ over a treatment duration of from 10 to 60 minutes. This specific concentration is believed to be the solid solubility limit of boron in silicon.

Figure 9:
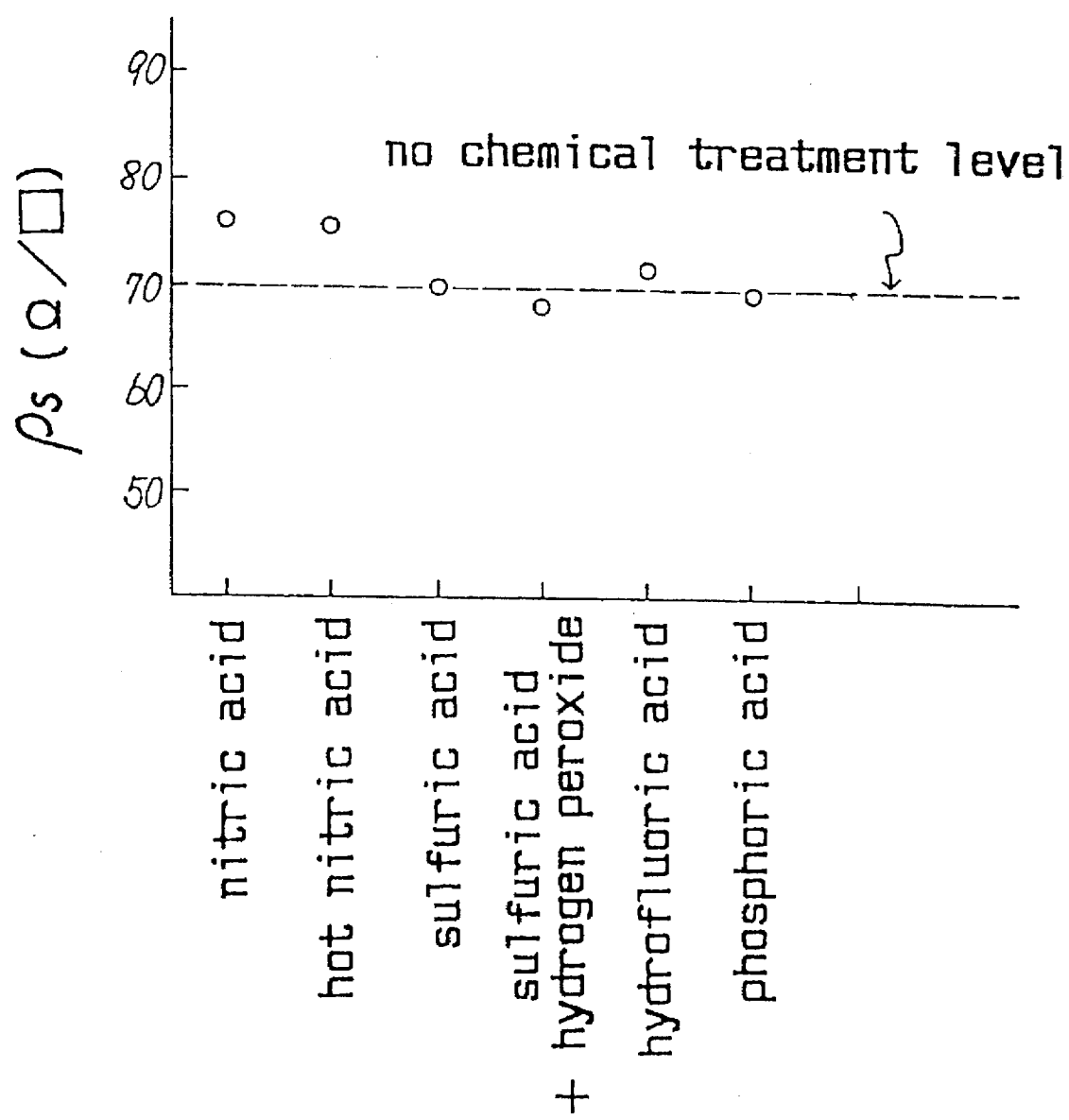
FIG. 9 is a graph which illustrates the chemical resistance of a boron silicide film.

FIG. 9 shows the result obtained on boron silicide films through experiments for testing resistance against chemicals. The boron silicide film having been formed on the exposed silicon surface but before the diffusion treatment was subjected to chemical treatment using a variety of chemicals. The sheet resistivity $\rho_s$ of the boron diffusion layer was measured thereafter. The sheet resistivity obtained on an untreated sample is also indicated by the broken horizontal line on the graph for comparison. It can be seen that the sheet resistivity is slightly increased for samples subjected to chemical treatments using nitric acid and hot nitric acid as compared with that of the untreated sample; however, the increase is small and can be almost neglected. It can be seen furthermore that chemical treatments each using sulfuric acid, a mixture of sulfuric acid with aqueous hydrogen peroxide, hydrofluoric acid, and phosphoric acid have essentially no influence on the sheet resistivity. It can be said therefore that boron silicide films are extremely stable against chemicals.

Figure 10:
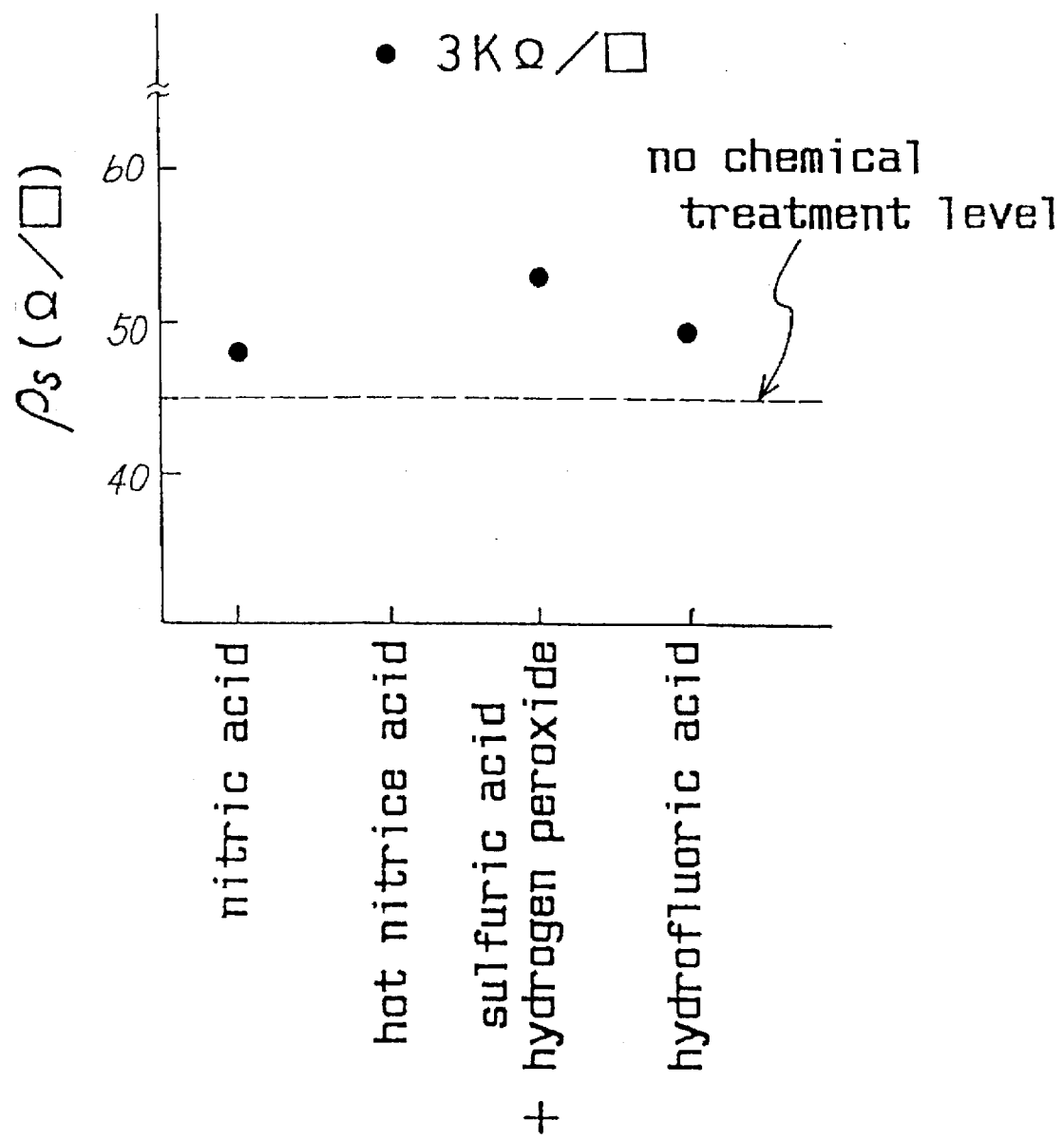
FIG. 10 is a graph which illustrates the chemical resistance of a boron film.
Figure 11A:
FIGS. 11 show process steps for a second embodiment of a process for fabricating a semiconductor device according to the present invention.
Figure 11B:
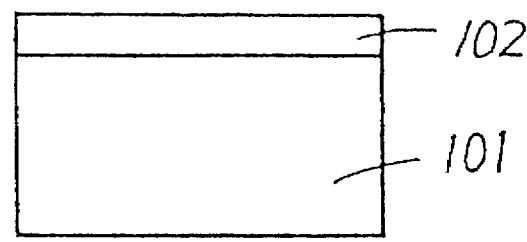
Figure 11C:
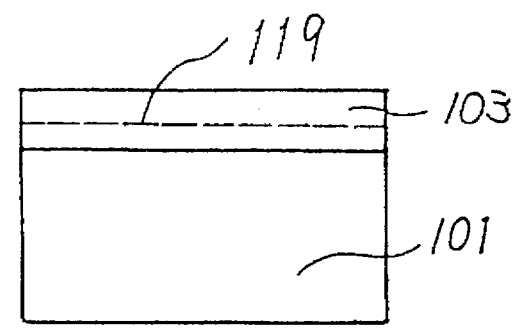
Figure 11D:
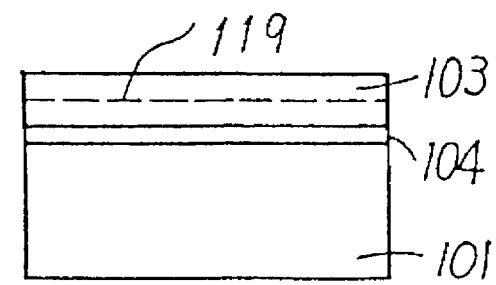

In FIG. 10 is shown the chemical resistance of a boron film to be compared with the results shown in FIG. 9. The data plotted in this graph were obtained by measuring the sheet resistivity of a boron diffusion layer obtained by diffusion treatment using a boron film as the diffusion source. The boron film thus obtained, but before the diffusion treatment, was subjected to chemical treatment using a variety of chemicals. The level of sheet resistivity obtained on an untreated sample is shown in the graph by a broken horizontal line as a control. It can be seen that the sheet resistivity increases somewhat for the samples which were subjected to each of the treatments with nitric acid, a mixture of sulfuric acid with aqueous hydrogen peroxide, and hydrofluoric acid. Particularly in the sample treated with hot nitric acid, the sheet resistivity is observed to soar up to 3 k$\Omega$/sq. The extremely high resistivity is ascribed to the dissolution of the boron film on treatment with hot nitric acid, which made it impossible to sufficiently diffuse the boron atoms. Conclusively, boron films are inferior to boron silicide films with respect to chemical resistance.

A second embodiment of the impurity diffusion process according to the present invention is described with reference to FIG. 11. The first step A comprises cleaning the Si substrate 101 to remove the native oxide film from the surface thereof. This step is similar to step A as described with reference FIG. 1. In the subsequent step B, a boron film 102 is deposited on the thus exposed active surface of Si substrate 101. This step differs from that shown in FIG. 1 as described in the first embodiment in that a boron film 102 is first deposited on the surface of the substrate instead of the boron silicide film in the first embodiment.

Then, in step C, the boron film 102 is converted into a boron silicide film 103. Because a boron film is chemically unstable as compared with a boron silicide film, it is preferred that the boron film 102 is immediately placed in an N2 gas atmosphere or reacted to form a silicide. Otherwise, a boron film would be easily oxidized on exposure to air. On reacting the boron film into boron silicide film 103, an extremely shallow boron diffusion layer is formed simultaneously between the Si substrate 101 and the boron silicide film 103, below the original surface 119 of substrate 101. In the final step D, the atomic boron in the boron silicide film 103 is allowed to diffuse into the Si substrate 101 to form diffusion layer 104. This step D is conducted in the same manner as the step C illustrated in FIG. 1. Furthermore, the parameters of boron diffusion layer 104 can be freely controlled by effecting an additional diffusion treatment at a temperature higher than that used in reacting boron with silicon to obtain boron silicide. An additional diffusion treatment at a higher temperature, for example, increases the diffusion boron concentration adjacent the substrate surface, because the concentration depends on the solubility limit which is a function of the temperature.

The step B, which is the characteristic step of the present embodiment, is described in further detail below. After completion of the substrate cleaning of step A, the introduction of hydrogen gas which was used for the removal of native oxide film is stopped, and the substrate temperature is set at a level lower than 700° C. and at which boron would not undergo silicide reaction. After attaining the targeted temperature and a stable state, a process gas containing boron or a gas of a boron compound, i.e., diborane (B$_2$H$_6$), is introduced to the surface of the Si substrate 101 for a predetermined duration under a condition, for example, at which the interior pressure of the vacuum chamber is maintained at $1.3 \times 10^{-2}$ Pa, to thereby form boron film 102. The substrate temperature in this case is set to a level lower than 700° C. which is required for pyrolyzing diborane and for depositing boron. Preferably, the substrate temperature is selected in the range of from 500° to 700° C. from the viewpoint of accelerating the deposition rate. In the case of a CVD film, however, a film deposition at a substrate temperature of 400° C. leads to the formation of a boron film 102 containing a large amount of hydrogen. Otherwise, the boron film may be subjected to deposition treatment at a temperature of 700° C. or higher. In this case, as read from the graph of FIG. 4, the formation of a boron silicide film 103 is assumed to proceed in parts simultaneously with the formation of the boron film. The amount of adsorbed boron, i.e. the film thickness of the boron film 102, can be set as desired by controlling the substrate temperature and the pressure and duration of the diborane gas introduction into the chamber. The boron film is formed selectively on the exposed surface of the Si substrate so long as a thin film is formed.

The boron film 102 thus obtained then undergoes reaction to form a boron silicide film 103. More specifically, the boron atoms inside the boron film 102 react with silicon atoms inside the silicon substrate 101 to form boron silicide film 103. Thus, it can be seen that the boron silicon film 103 forms selectively on portions at which boron film 102 had been formed on the exposed surface of the silicon substrate. When a boron film is formed on an oxide film, the boron atoms diffuse only into the oxide film.

In step D, a boron diffusion layer 104 is formed using the boron silicide film 103 as the solid diffusion source.

In the present embodiment, the boron film 102 is formed by pyrolyzing diborane gas and thereafter allowing the boron atoms obtained therefrom to be adsorbed on the active surface of the Si substrate. However, the process according to the present invention is not limited only thereto, and other processes may be employed as well for the deposition of the boron film 102, such as molecular beam epitaxy (MBE), chemical vapor deposition (CVD), and physical vapor deposition (CVD) inclusive of vacuum deposition, sputtering, etc. Furthermore, a method such as spin coating can be used. It then follows that a low temperature process, which can be conducted at the level of room temperature, is also applicable for forming the boron film 102.

The process of the present embodiment comprises initially forming a boron film 102, and then heat treating it to obtain a boron silicide film 103. As described hereinbefore, the boron film 102 is inferior to the boron silicide film 103 with respect to chemical stability. In other words, the boron film 102 can be easily etched using a particular chemical. Thus, in selectively forming a boron diffusion layer 104 or a boron diffusion region, it is preferred to subject the boron film 102 to patterning by employing the process of the present embodiment. It can be understood from the graph of FIG. 10 that a hot nitric acid, for example, can be used advantageously as the etching solution. Alternatively, ion milling or dry etching can be applied instead of wet etching.

One can take advantage of the difference in chemical property between a boron silicide film and a boron film for accurate control of dopant concentration. An un-reacted boron film usually remains on the boron silicide film which already reacted with silicon when $B_2H_6$ is supplied at above 600° C. In other words, the adsorbed boron layer consists of a boron silicide layer and a boron layer in the case of such a process condition. Existence of a boron film in the diffusion step occasionally causes undesirable results such as non uniform distribution of sheet resistivity which depends on distribution of film thickness or instability in chemical treatment of the boron film at a process step between formation of the adsorbed boron layer and solid phase diffusion. Therefore, accurate control of the carrier concentration in the boron doped layer can be effectively improved by removing the boron film as a preliminary to solid phase diffusion. Similarly, in the case of $B_2H_6$ injection at less than 600° C., the boron film should be partially turned to boron silicide by thermal treatment above 600° C. and the continuously un-reacted boron film should be selectively removed prior to solid phase diffusion. Thus, as silicide formation is essentially limited only by temperature, the thickness of the boron silicide film is necessarily made uniform.

Figure 12A:
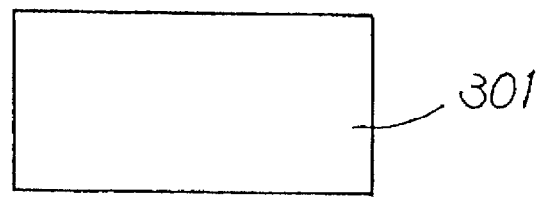
FIGS. 12 show process steps for a third embodiment of a process for fabricating a semiconductor device according to the present invention.
Figure 12B:
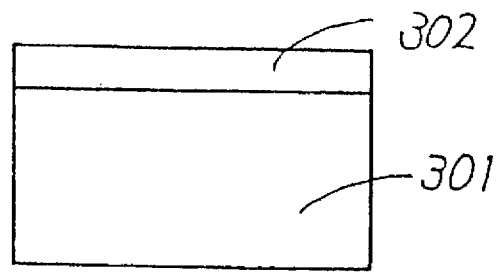
Figure 12C:
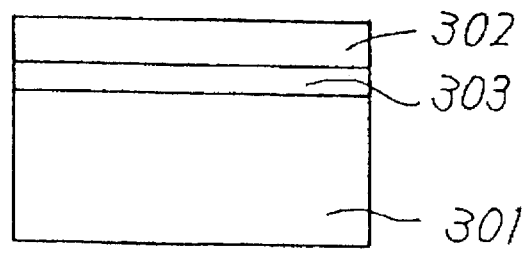
Figure 13A:
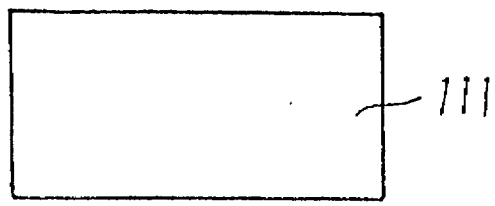
FIGS. 13 show process steps for a fourth embodiment of a process for fabricating a semiconductor device according to the present invention.
Figure 13B:
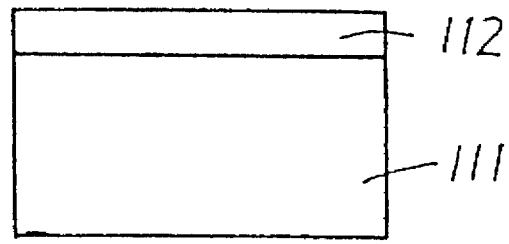
Figure 13C:
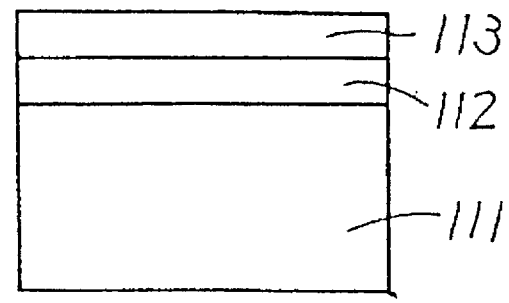
Figure 13D:
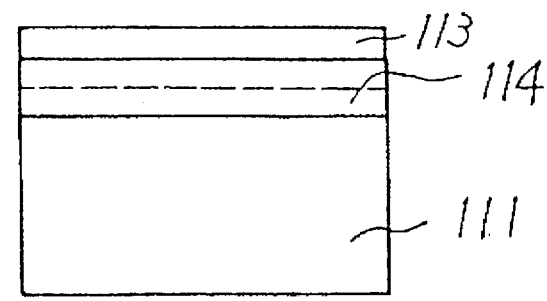
Figure 13E:
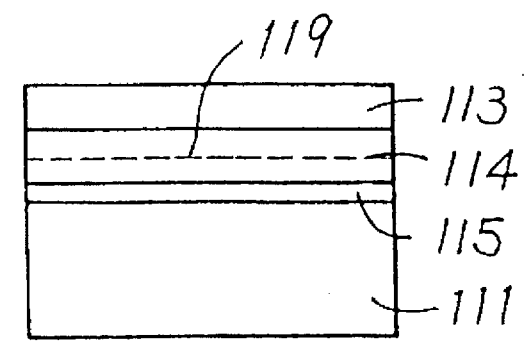

Referring to FIG. 12, a third embodiment of the impurity diffusion process according to the present invention is described below. In contrast to the first and second embodiments described hereinbefore, in which the silicon atoms for the boron silicide film are supplied from the silicon substrate, the third embodiment comprises supplying both boron atoms and silicon atoms by a gas supply.

In step A, the native oxide film is removed from the surface of the Si substrate 301. This step is similar to those employed in the first and the second embodiments described above.

The step B comprises supplying diborane ($B_2H_6$) and dichlorosilane ($SiH_2Cl_2$) as the gases for forming a boron silicide film on the exposed active surface of the Si substrate 301. The vacuum chamber and the wafer are both heated to 800° C. during this step. A boron silicide film can be deposited selectively on the surface of the Si substrate 301 at a rate of about 10 Å/min by, for example, supplying diborane at a pressure of $1 \times 10^{-3}$ Torr and dichlorosilane at $1 \times 10^{-6}$ Torr. In the present embodiment, the boron silicide film 302 is deposited on the upper surface of the Si substrate 301. Because both boron atoms and silicon atoms are supplied externally by the pyrolysis of a gas, the boron silicide film is of a deposition type. The use of silane ($SiH_4$) as a gas for supplying silicon atoms enables formation of the boron silicide film at a temperature as low as about 500° C.

In the case of fabricating a deep diffusion layer, in the subsequent step C, the boron atoms inside the boron silicide film may be thermally diffusion into the silicon substrate 301 to obtain a boron diffusion layer 303.

The distinguishing feature of the present embodiment, as compared with the conventional processes based on epitaxial growth of silicon containing impurity atoms, is that the boron silicide film according to the present invention comprises boron as the principal component. More specifically, boron is incorporated in the film in an amount far above the solubility limit thereof in silicon, and accounts for 50% or more of the entire film. The films obtained by conventional epitaxial growth contain boron in an amount less than the solubility limit, and the texture thereof is also based on that of silicon.

Referring to FIG. 13, the impurity diffusion process according to a fourth embodiment of the present invention is described below. The process according to the present embodiment is a modification of the second embodiment, and is characterized in that a cap film is formed with the aim to prevent the diffusion of the boron atoms from the silicide film outwardly away from the substrate (out diffusion) during the reaction of a boron film with silicon to form the boron silicide film or during diffusion, or to prevent oxidation of the boron film.

The first step A comprises cleaning the surface of the Si substrate 111. In the subsequent step B, a boron film 112 is deposited on the surface of the Si substrate 111. This step is carried out in the same manner as step B of FIG. 1. Then, the boron film 112 is coated with a cap film 113 in the next step C.

The subsequent step D comprises converting the boron film 112 into a boron silicide film 114 by thermally treating the boron film at a substrate temperature of 700° C. or higher. In the final step E, boron is diffused into the substrate III using the boron silicide film 114 as the diffusion source. In step E, the original surface of substrate 111 is shown at 119. As a result, a boron diffusion layer 115 is formed simultaneously at the boundary between the Si substrate 111 and the boron silicide film 114, while cap film 113 prevents out diffusion from occurring. That is, the cap film 113 prevents diffusion of boron into a film (not shown in the figure) which is formed on the upper side of film 113 away from the boron silicide film 114. The cap film may be made of, for example, a silicon nitride film, and may be formed by a CVD process or the like. The cap film is formed at a temperature lower than 700° C., to avoid formation of a silicide film from the boron film.

Figure 14A:
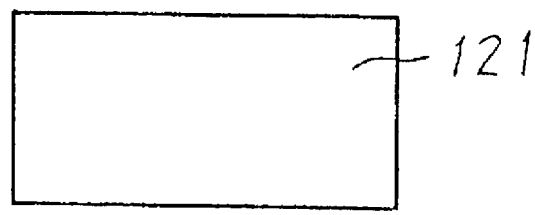
FIGS. 14 show process steps for a fifth embodiment of a process for fabricating a semiconductor device according to the present invention.
Figure 14B:
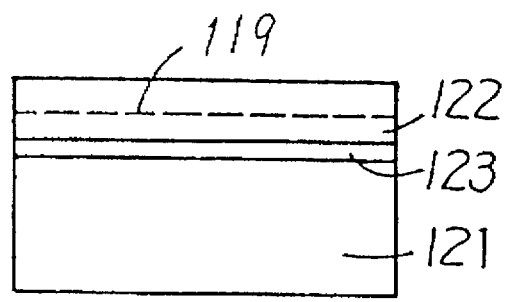

A fifth embodiment of the impurity diffusion process according to the present invention is described below referring to FIG. 14. In the first step A, the surface of the Si substrate 121 is cleaned in the same manner as for the previously-described embodiments. In the subsequent step B, a boron silicide film 122 is formed directly on the thus cleaned surface of the Si substrate 121. At this point, the substrate is heated to 700° C. or higher to form simultaneously a boron diffusion layer 123 between the boron silicide film 122 and the Si substrate 121. That is, step B involves a simultaneous thermal diffusion treatment to introduce boron impurity atoms from the boron silicide film 122 into the silicon substrate 121. In step B, the original surface of substrate 121 is shown at 119.

As described above, the process according to the present embodiment is different from that of the first embodiment as shown in FIG. 1 in the point that the treatment step for forming the boron silicide layer and the diffusion step are effected in a single step. A boron diffusion layer 123 having a desired depth profile of the impurity concentration can be obtained by controlling the treatment step for forming the boron silicide film as well as the substrate temperature and duration of heating. With respect to the case in which the duration of thermal treatment is varied, for example, reference can be made to the graph as shown in FIG. 8. In this case, the substrate is heated and annealed at a temperature set within a range up to about 1,100° C.

Generally, however, the step of forming the boron silicide layer and the diffusion step are separated, and the conditions such as they relate to temperature and atmosphere differ from one step to the other. When conducting the steps separately, the diffusion step or the annealing step is effected in a vacuum or an inert gas atmosphere. By carrying out those steps, a boron diffusion layer 123 can be formed using the boron silicide film 122 as the diffusion source, while simultaneously activating the impurity, i.e., atomic boron. A boron impurity diffusion layer 123 having a desired impurity concentration and junction depth can be obtained by controlling the conditions of annealing, i.e. the substrate temperature and the duration of heating.

The as-formed boron silicide film 122 in the process of the present embodiment is annealed in the same vacuum chamber used for the preceding steps. However, the process need not be confined to this, and modifications can be made, such as taking out the substrate from the vacuum chamber and annealing it inside another apparatus using a lamp annealing process.

Figure 15:
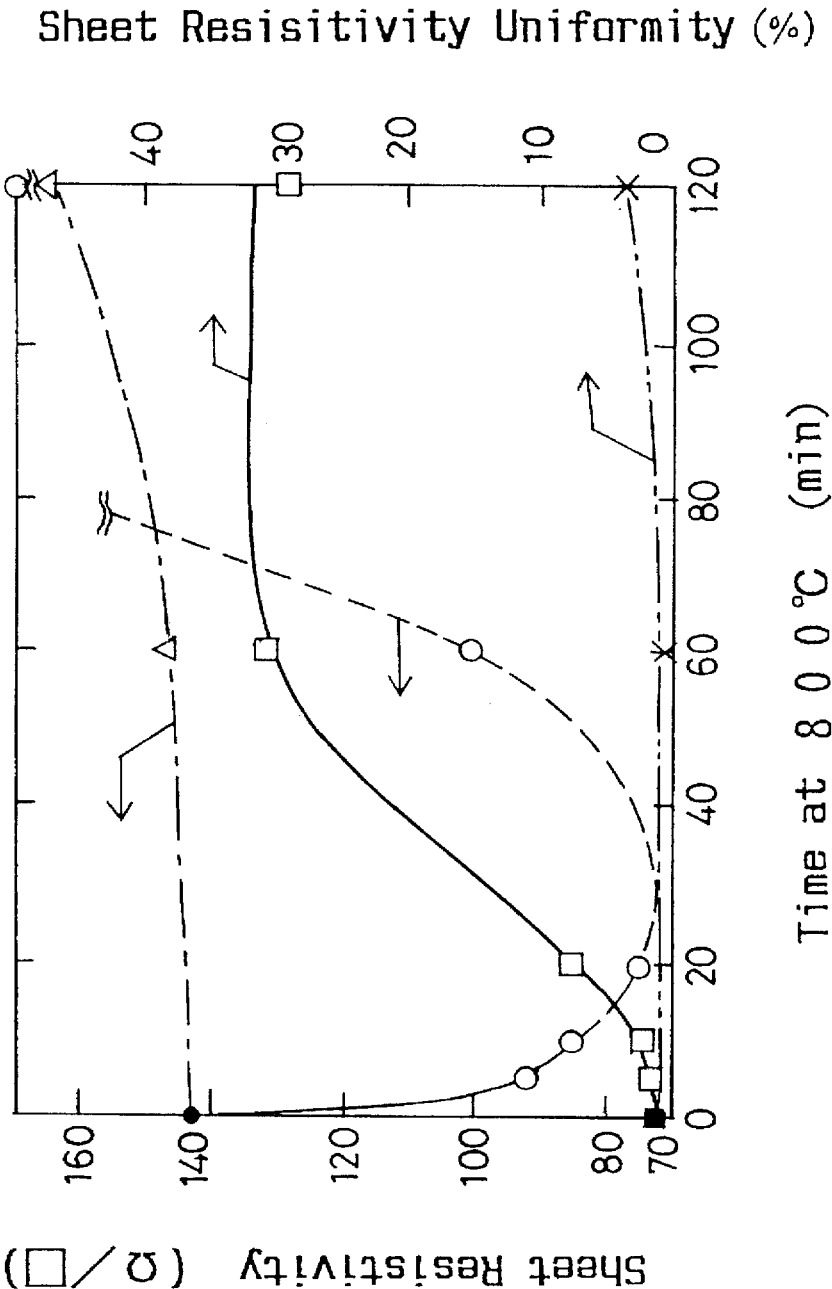
FIG. 15 is a graph which relates the sheet resistance of a boron diffusion layer and fluctuations thereof within a wafer to the duration of high temperature treatment before the diffusion treatment.

Special care must be taken in setting the conditions for the thermal treatment after the boron silicide film is formed. FIG. 15 shows the sheet resistivity of a diffusion layer obtained by thermal annealing in an $N_2$ gas atmosphere at 900° C. using, as the diffusion source, a boron silicide film which had been formed at 800° C. The abscissa represents the time interval during which the diffusion layer was left at 800° C. before effecting the annealing at 900° C., the left hand ordinate represents the sheet resistivity of the diffusion layer and right hand ordinate represents sheet resistivity uniformity, or the in-plane fluctuation thereof obtained after annealing the diffusion layer at 900° C. The diffusion layer samples were left at 800° C. in either an $N_2$ atmosphere or in an $O_2$ atmosphere. The broken line curve shows sheet resistivity as a result of exposure to an $O_2$ atmosphere, the dot-dash chain line curve shows sheet resistivity as a result of exposure to an $N_2$ atmosphere, the solid line curve shows sheet resistivity uniformity as a result of exposure to an $O_2$ atmosphere, the dot-dot-dash chain line curve shows sheet resistivity uniformity as a result of exposure to an $N_2$ atmosphere.

It can be seen clearly from FIG. 15 that the sheet resistivity changes considerably by oxygen being incorporated in the atmosphere at a small amount, even at a low temperature below the annealing temperature of 900° C. When the duration of exposure to oxygen is short, i.e. 30 minutes at a temperature of 800° C., for example, an accelerated diffusion occurs. When the duration is long, i.e. 30 minutes or longer at 800° C., on the other hand, the boron silicide film is oxidized to yield a high sheet resistivity. Accordingly, not only the temperature and/or the atmosphere, but also the duration should be controlled during the transition stage from the diffusion step to the step of the annealing treatment. Preferably, the annealing treatment is conducted in an atmosphere maintained such that oxidation would not occur. If unavoidable oxygen is incorporated in the atmosphere, the time as well as the pressure during the transition stage must be controlled.

Figure 16:
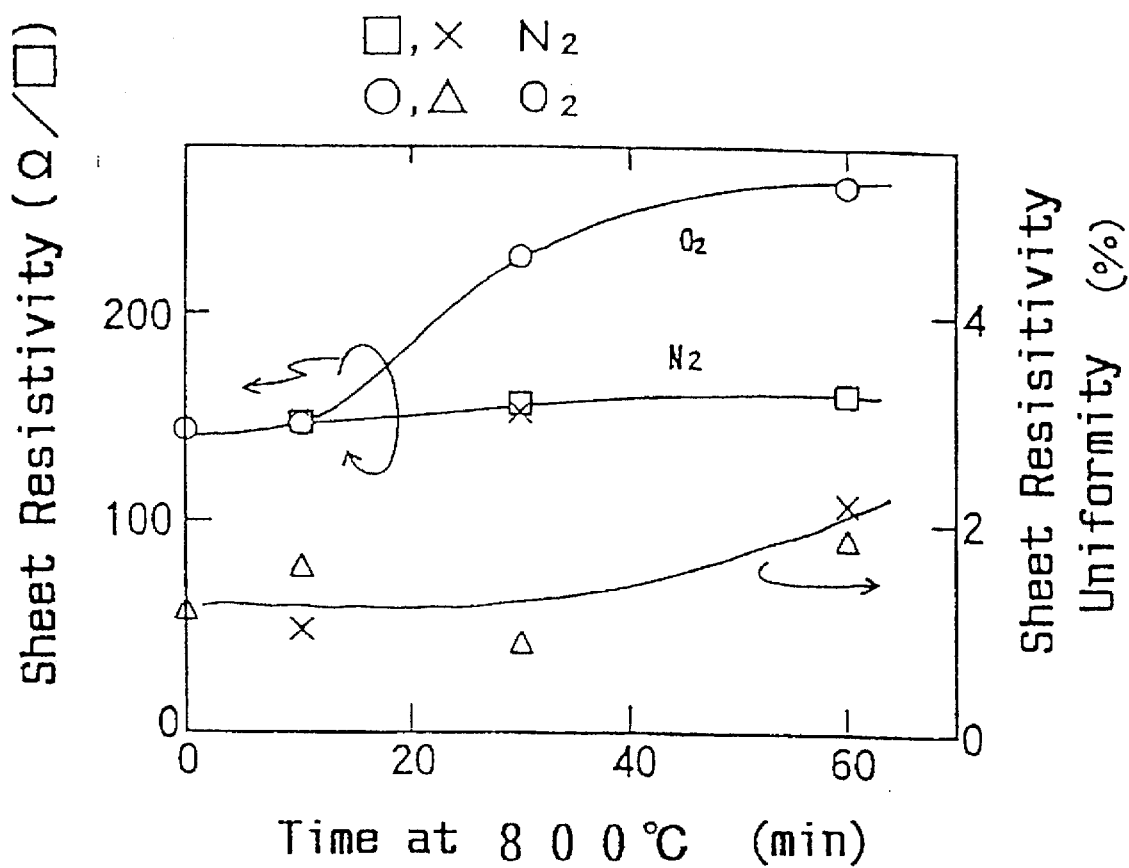
FIG. 16 is a graph which relates the sheet resistance of a boron diffusion layer and fluctuations thereof within a wafer to the duration of high temperature treatment after the diffusion treatment.

FIG. 16 shows the sheet resistivity and the in-plane fluctuation thereof within the wafer of the case of a diffusion layer obtained by allowing the diffusion layer to stand at 800° C. in an $N_2$ atmosphere and an $O_2$ atmosphere after subjecting it to annealing and diffusion at 900° C. in an $N_2$ atmosphere using a boron silicide film formed at 800° C. as the diffusion source. The abscissa in the figure shows the duration of exposure of the layer to a temperature of 800° C.; the ordinates are as in FIG. 15. It can be seen clearly from the figure that the sheet resistivity also increases by the oxidation which occurs on the diffusion layer after annealing.

It can be concluded from the foregoing that the thermal treatment after forming the boron silicide film, i.e. not only the annealing but also the low temperature processes precedent to or after the annealing, must all be carried out in an inert gas atmosphere devoid of oxygen or under a high vacuum. The annealing step is preferably conducted under vacuum or in an inert gas atmosphere such as an $N_2$ gas atmosphere. If the annealing were to be conducted in an active atmosphere containing oxygen gas, moisture, etc., the surface of the boron silicide film would undergo oxidation to suffer a non-uniform sheet resistivity in the boron diffusion layer.

Figure 17:
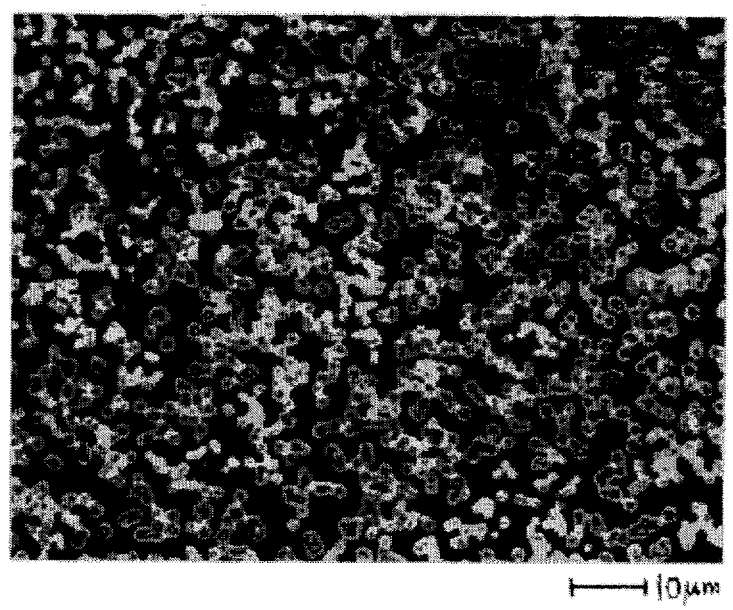
FIG. 17 is a photomicrograph of the surface of a wafer after annealing a boron silicide film.
Figure 18A:
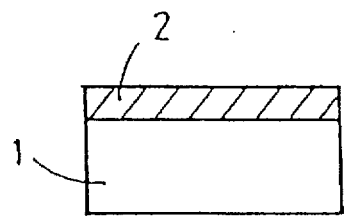
FIGS. 18 illustrate removal of a boron silicide film.
Figure 18C:
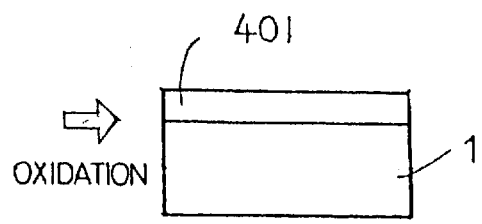
Figure 18B:
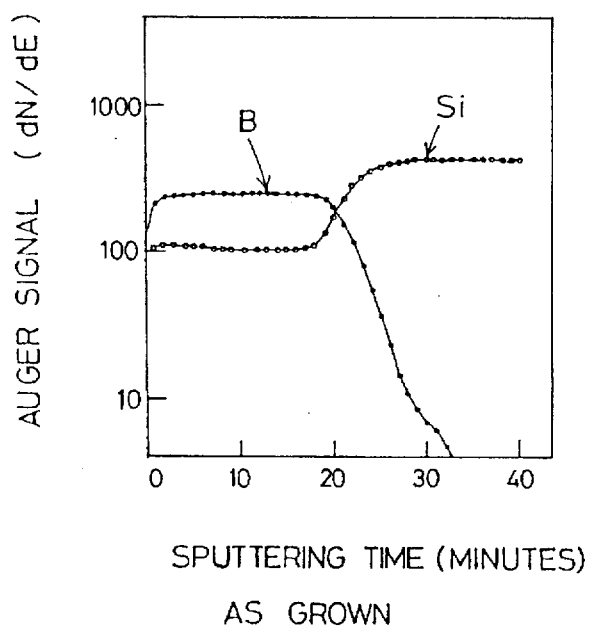
Figure 18D:
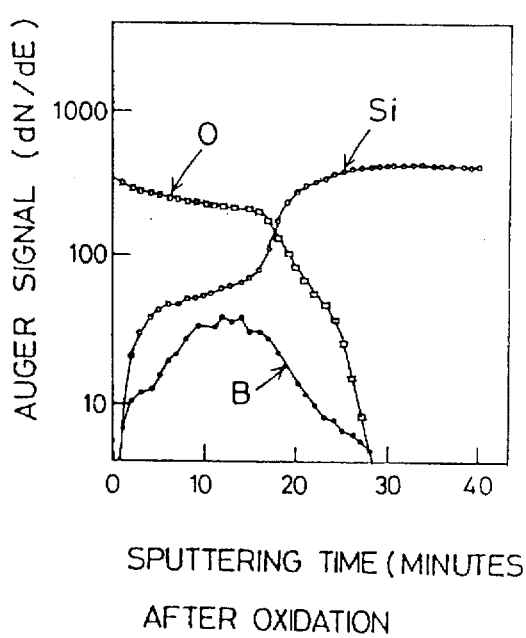

FIG. 17 is the micrograph of the surface of the boron silicide film which has undergone change due to annealing in an active atmosphere. It can be seen that the annealing process produces fine grains partially on the surface of the wafer which exhibit a milky white appearance. By observing the milky white portion at a 1,000×magnification, it is found to be composed of fine grains of boron oxides and boron silicon oxides. The sheet resistivity of this portion is extremely high. Presumably, this is due to oxygen being incorporated into the boron silicide film in the course of oxidation.

The formation of fine grains during annealing under differing atmospheric conditions is summarized in Table 2. The formation of fine grains with differing annealing temperatures and atmospheres is given therein. The notation O indicates that no fine grains were observed to form, and the notation X indicates the generation of fine grains. It can be seen from Table 2 that no fine grains form on annealing at any temperature in vacuum or in a nitrogen gas atmosphere. In contrast, annealing in an oxygen gas atmosphere generates fine grains in the temperature range of from 500° to 800° C. due to the surface oxidation of the boron silicide film. Similarly, fine grains form on annealing in an atmosphere containing moisture.

To prevent formation of such fine grains, the diffusion should be conducted at a temperature higher than 800° C. Furthermore, the heating rate for achieving a high temperature for the diffusion step or the rate of cooling from a high temperature must be set at 10° C./min or higher. By increasing the heating and cooling rates, the treatment time in the temperature range of from 500° C. to 800° C. can be reduced to prevent the formation of fine grains. The initial heating temperature for the boron silicide layer from room temperature must be lower than 500° C. If it were to be elevated to 500° C. or higher, the generation of fine grains cannot be prevented.

TABLE 2

| Temperature (°C.) | 400 | 500 | 600 | 700 | 800 | 900 | 1,000 |
|---|---|---|---|---|---|---|---|
| Vacuum or in $N_2$ | 0 | 0 | 0 | 0 | 0 | 0 | 0 |
| In $O_2$ | 0 | X | X | X | X | 0 | 0 |
| In $H_2O$ | — | — | X | X | X | 0 | 0 |

In fabricating a semiconductor device with an impurity diffusion process according to the present invention, there may be cases in which the boron silicide layer used as the solid diffusion source requires removal. However, since the boron silicide layer is extremely stable both chemically and physically, etching thereof is difficult. In such cases, oxidation can be used in reverse to facilitate removal of the boron silicide film.

An example of this removal process is illustrated in FIGS. 18. In this process, the boron silicide film 2 which has been formed directly on the surface of a Si substrate 1, as shown in FIG. 18A, is once oxidized, for example, by subjecting it to wet oxidation at a substrate temperature of from 400° to 800° C. for a duration of about 5 minutes. A dry oxidation process may be used in the place of wet oxidation. In this manner is obtained an oxide film 401 from the boron silicide film, as represented in FIG. 18C. Thus, the boron silicide film is oxidized and becomes no longer as resistant to chemicals and so is more easily removed by etching, for example, using hydrofluoric acid.

In FIG. 18 is further shown for reference the concentration profile of the boron silicide film before (FIG. 18B) and after (FIG. 18D) the oxidation treatment thereof. A simple comparison of the concentration profiles reveals that a considerable amount of oxygen is introduced into the boron silicide film after the oxidation treatment.

Figure 19:
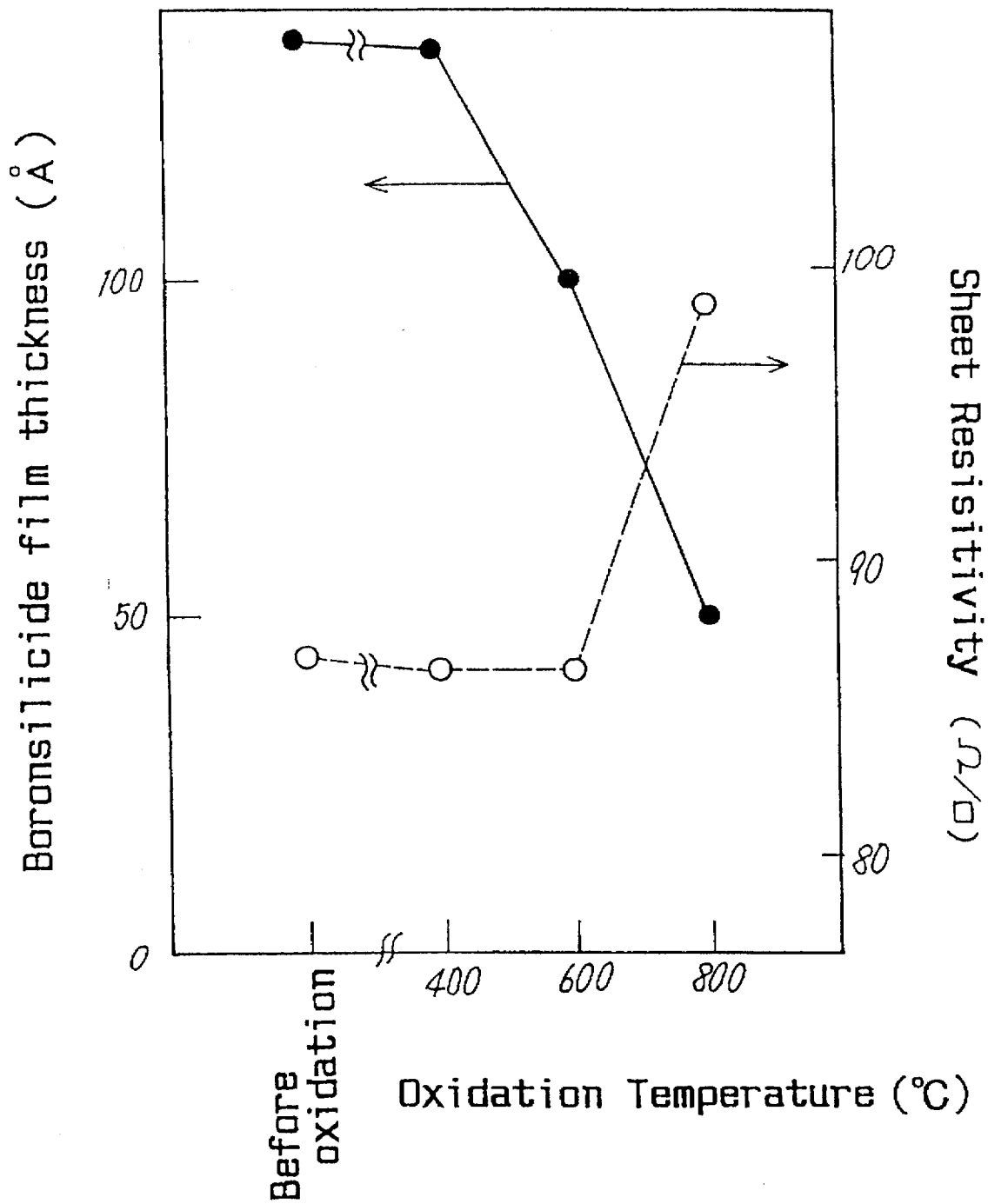
FIG. 19 is a graph which shows the film thickness of a boron silicide film and the sheet resistance of the diffusion layer after the diffusion treatment with respect to the oxidizing conditions of a boron silicide film.
Figure 20A:
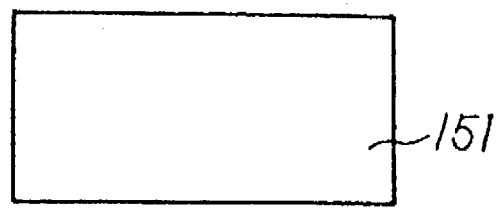
FIGS. 20 shows process steps for a sixth embodiment of a process for fabricating a semiconductor device according to the present invention.
Figure 20B:
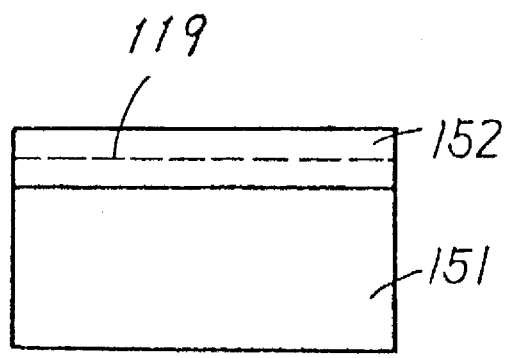
Figure 20C:
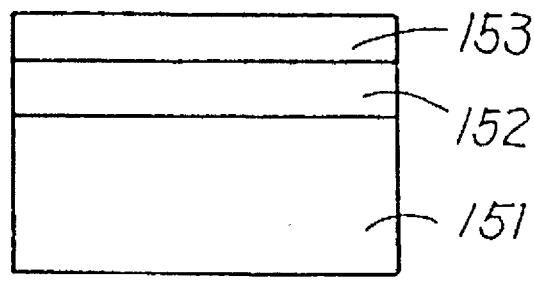
Figure 20D:
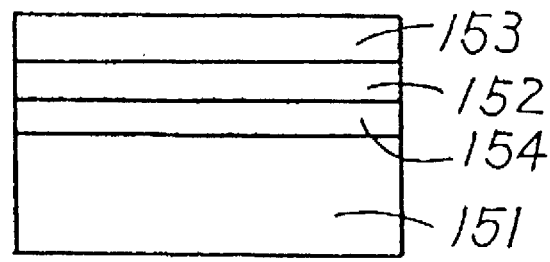

FIG. 19 shows the oxidation characteristics of a boron silicide film. In the graph, the film thickness of the boron silicide film before and after the oxidation, as well as the sheet resistivity of the diffusion layer after annealing are represented along the ordinate. A boron silicide film is susceptible to oxidation, and the film which was about 130 Å in thickness prior to oxidation treatment was easily reduced in thickness by the oxidation.

The oxidation rate of a boron silicide film is considerably lower than that of a boron film, but sufficiently higher than that of a silicon substrate. This signifies that a boron film undergoes oxidation at a temperature as low as 400° C. or lower, but that a boron silicide film is hardly oxidized in the same temperature range. At an elevated temperature not higher than 800° C., a boron silicide film can be easily oxidized, while a Si substrate does not undergo oxidation at all. Accordingly, the boron silicide film can be selectively removed without influencing the structure under the surface of the substrate by first preferably oxidizing the boron silicide film only in the temperature range of about 400° to 800° C., and then removing the oxide film thereafter using hydrofluoric acid or the like. It is not preferred to conduct the oxidation at a temperature of 800° C. or higher, because the Si substrate also undergoes oxidation at such a high temperature.

A sixth embodiment of the impurity diffusion process according to the present invention is described below with reference to FIGS. 20. First, the surface of Si substrate 151 is cleaned or activated in step A in the same manner as in the foregoing embodiments. In the subsequent step B, a boron silicide film 152 is formed on the surface of the Si substrate 151. This step B can be conducted in the same manner as, for example, the step B illustrated by FIG. 1 in the first embodiment, whereby boron silicide film 152 forms partly above and partly below the original level 119 of the surface of substrate 151. In the next step C, a cap film 153 is formed on the boron silicide film 152. The cap film 153 prevents out diffusion from occurring.

In the step C shown in FIG. 13 of the fourth embodiment above, the cap film 113 was formed on the boron film 112. The present embodiment, however, is different from the foregoing, and the cap film 153 is formed on the boron silicide film 152. In the final step D, a thermal diffusion treatment is effected to form a boron diffusion layer 154 between the boron silicide film 152 and the Si substrate 151. This step D can be carried out in the same manner as step C as described for the first embodiment with reference to FIG. 1. Cap film 153 prevents out diffusion from occurring and improves the uniformity of the sheet resistivity of the boron diffusion layer 154.

A silicon nitride film or a silicon oxynitride film is preferred as the cap film, and specifically preferred are, for example, an $Si_3N_4$ film and an SiON film which are deposited by a CVD process. The cap film is preferably formed at a low temperature not higher than 850° C., so that the boron atoms may not diffuse into the Si substrate 151 in a considerable amount. Silicon nitride and silicon oxynitride films are suited for the cap film because the diffusion rate of the boron atoms therein is extremely low.

Figure 21:
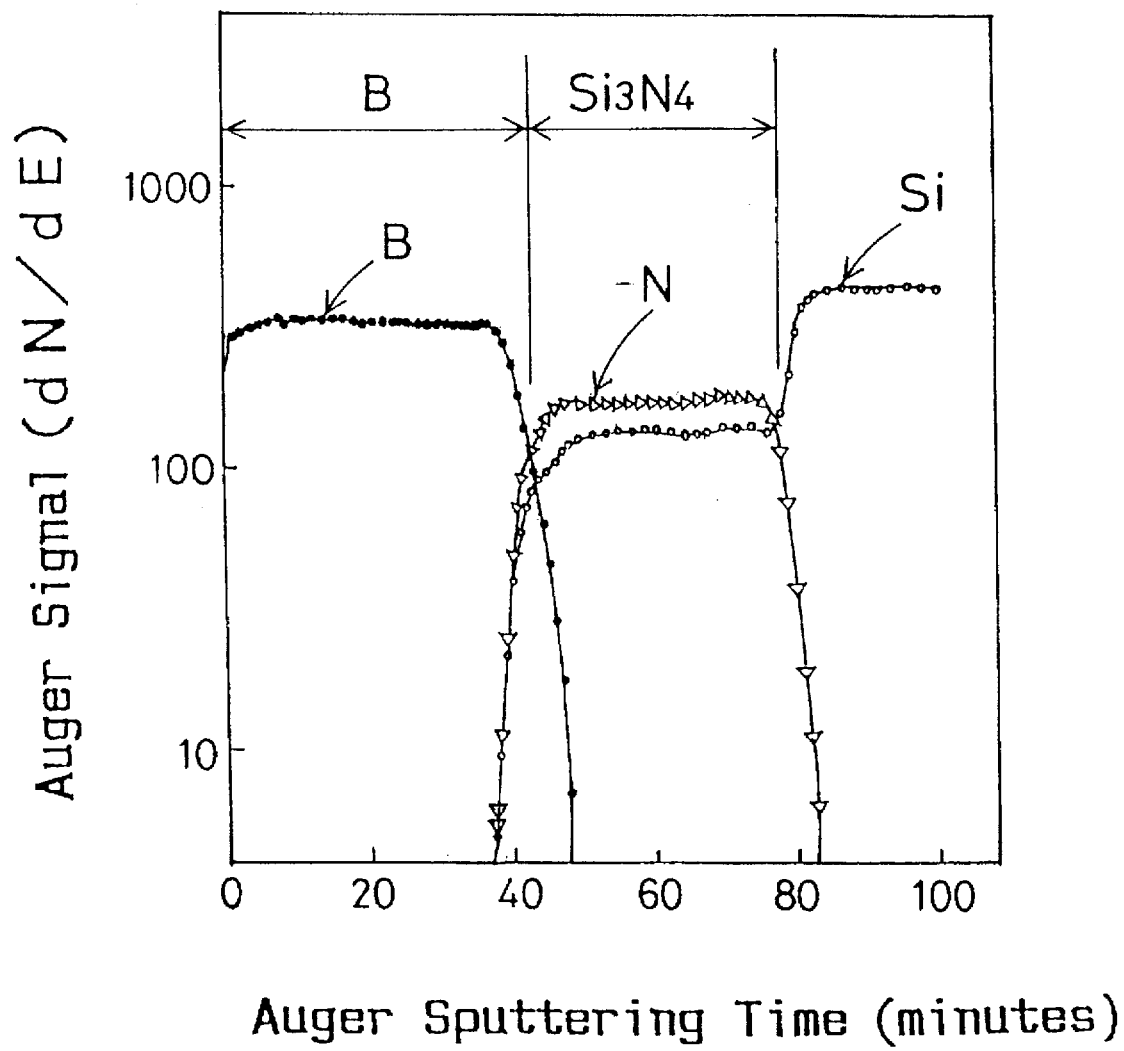
FIG. 21 is a graph showing the diffusion ability of boron with respect to a silicon nitride film.

FIG. 21 shows the depth profile of the atomic boron concentration in the boron film using a silicon nitride film as a barrier, or cap film. The depth profile was obtained by subjecting a sample obtained by depositing a boron film on the surface of a Si substrate incorporating therebetween a nitride film and thereafter annealing the resulting layer structure to an AES (acoustic emission spectroscopy) analysis. As is observed clearly from the profile of FIG. 21, the silicon nitride film blocks boron atoms to substantially prevent them from reaching the Si substrate. Thus, the diffusion of boron atoms into the external atmosphere can be hindered by forming a silicon nitride film as a cap film on the boron silicide film.

Figure 22:
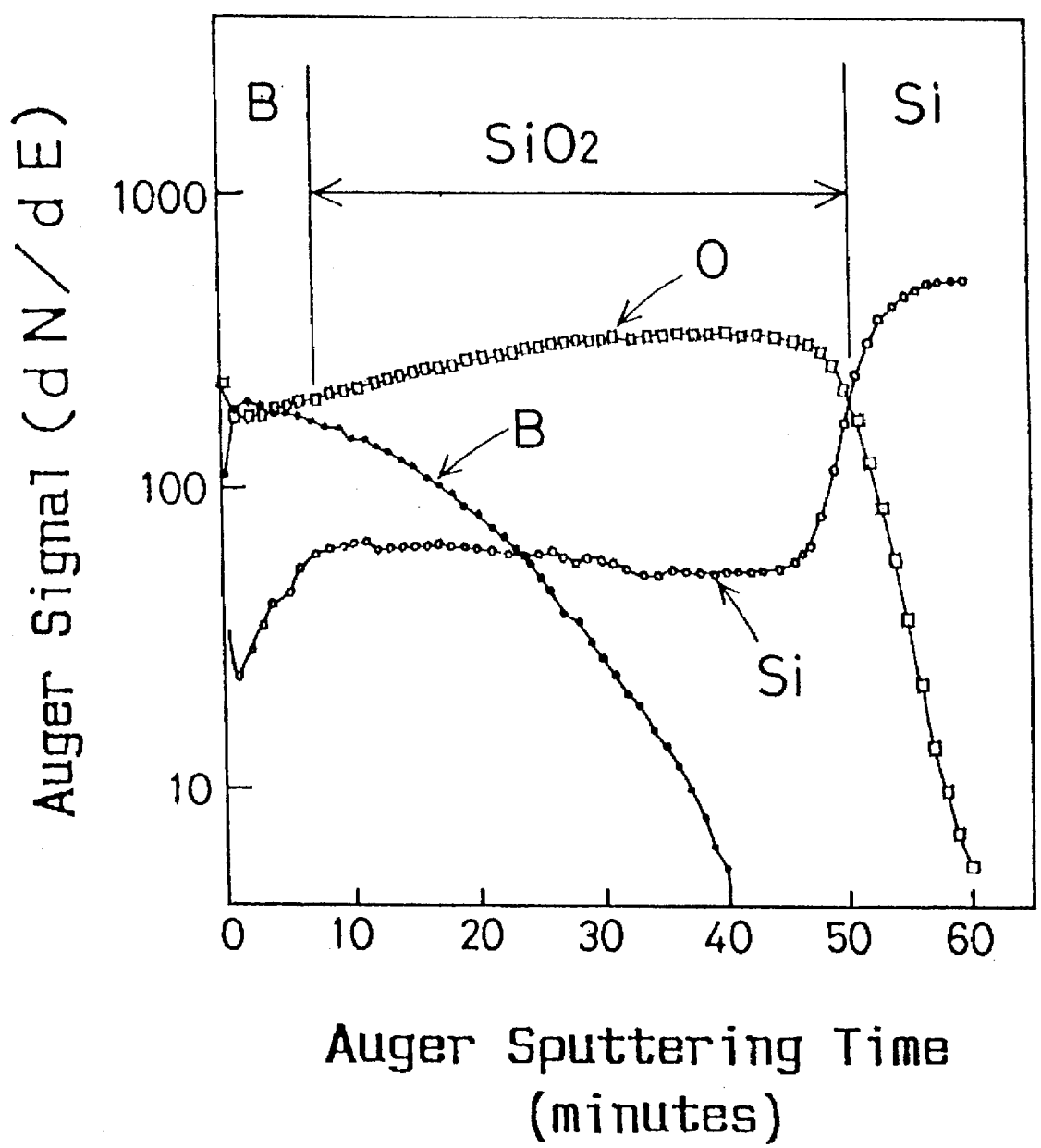
FIG. 22 is a graph showing the diffusion ability of boron with respect to a silicon oxide film.
Figure 23A:
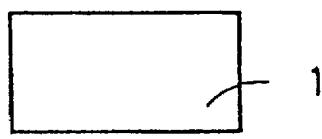
FIGS. 23 show two sequences of process steps to illustrate the degree of fluctuation of sheet resistance within a boron diffusion layer in relation with the presence or the absence of a cap film.
Figure 23B:
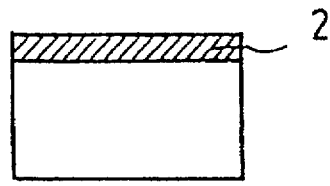
Figure 23C:
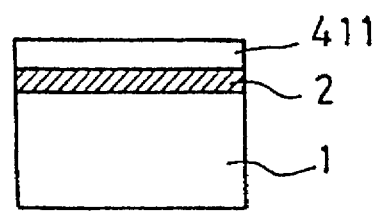
Figure 23D:
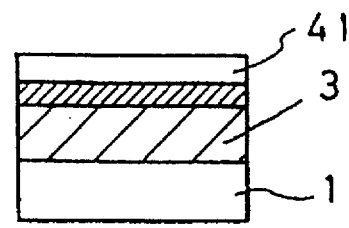
Figure 23E:
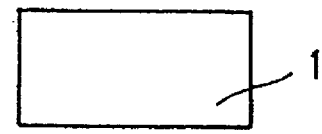
Figure 23F:
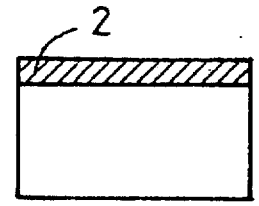
Figure 23G:
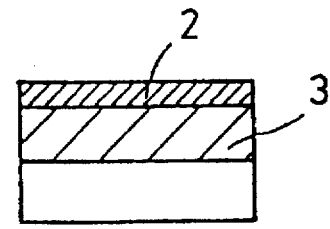
Figure 25A:
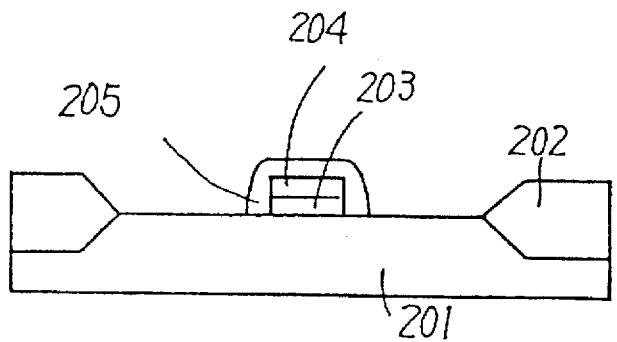
FIGS. 25 show process steps for an eighth embodiment of a process for fabricating a semiconductor device according to the present invention.
Figure 25B:
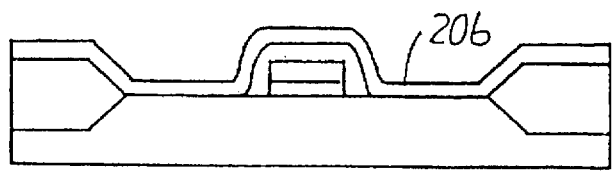
Figure 25C:
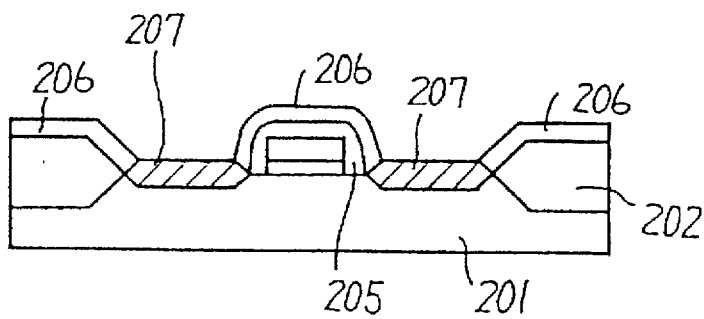
Figure 25D:
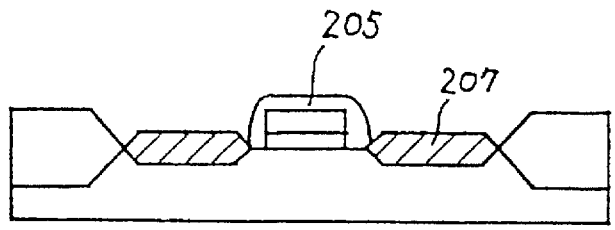
Figure 25E:
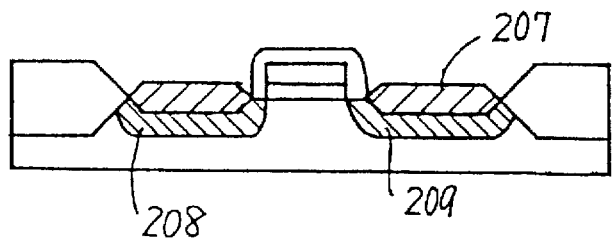
Figure 26A:
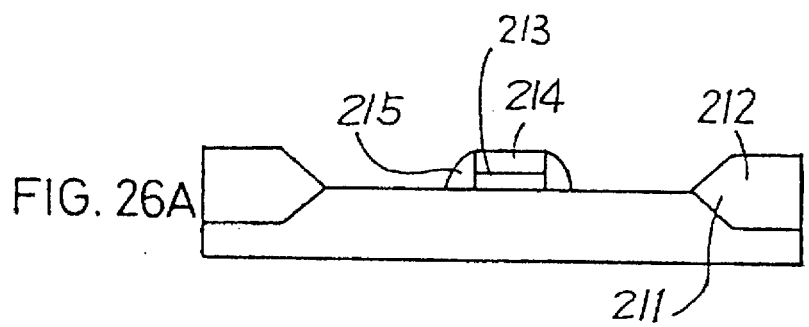
FIGS. 26 show process steps for a ninth embodiment of a process for fabricating a semiconductor device according to the present invention.
Figure 26B:
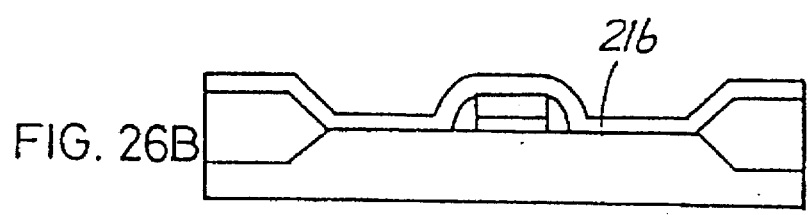
Figure 26C:
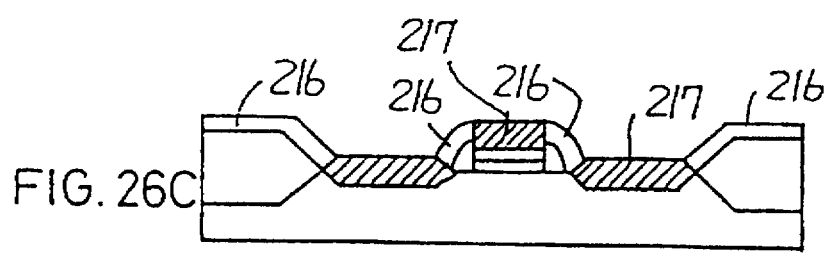
Figure 26D:
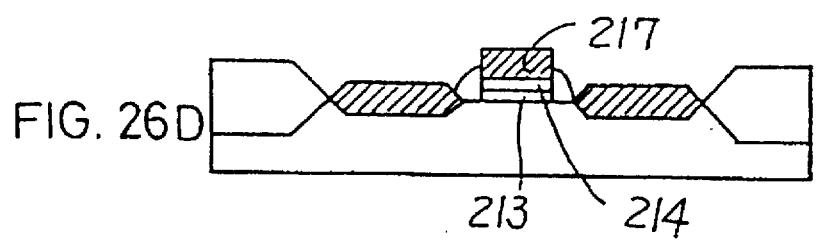
Figure 26E:
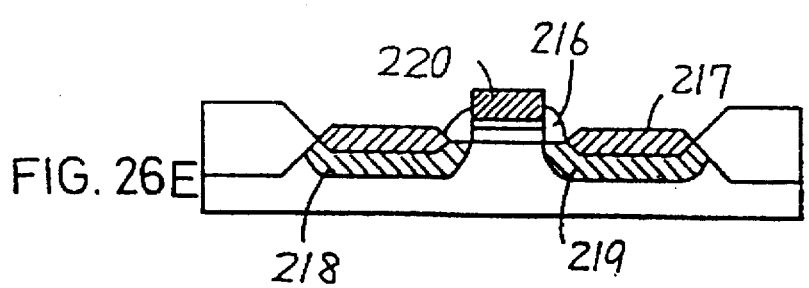

FIG. 22, which is provided for comparison, shows a depth profile of boron concentration inside the boron diffusion layer in case a silicon oxide film is used as the barrier in place of a silicon nitride film. Because boron atoms diffuse inside a silicon oxide film at a relatively high rate, the boron atoms readily intrude into the silicon oxide film. FIG. 22 indicates that the boron atoms have yet to travel through the thick silicon oxide film to reach the Si substrate. However, boron atoms would easily reach the Si substrate and diffuse therein if the annealing temperature and/or the annealing time were increased.

Diffusion treatments were conducted with and without a cap film, and the scattering of sheet resistivity $\rho_s$ within the diffusion layer was measured. The results are indicated in FIGS. 23 which depict two sequences of process steps according to the invention. The process comprising steps A, B, C, and D is the one in which a silicon nitride cap film was used, and the other comprising steps E, F, and G corresponds to the process using no cap films 411. The diffusion layer obtained as a result by the former process (steps A–D) yielded an average sheet resistivity of 72.9Ω/sq, with a variance σS of 4.2% with respect to the average sheet resistivity $\bar{\rho}_s$, whereas that resulting from the latter process (steps E–G) yielded an average sheet resistivity of 80.1Ω/sq with a σS of 9.7% with respect to the average sheet resistivity $\bar{\rho}_s$. Conclusively, the use of a cap film 411 prevents out diffusion and oxidation of boron silicide film during the diffusion treatment from occurring to control fluctuation of the sheet resistivity inside the impurity diffusion layer 3 to less than a half of that of a diffusion layer obtained without using any cap films.

Referring to FIG. 24, a seventh embodiment of the impurity diffusion process according to the present invention is shown and will be described below. In the first step A, a boron silicide film 192 is formed on the surface of an Si substrate 191. This boron silicide film is then used as a diffusion source to effect solid phase diffusion to establish a boron diffusion layer 193. This step is the same as those described in the foregoing first and sixth embodiments.

This embodiment is characterized by the subsequent step B, which comprises removing the residual boron silicide film 192 which remains after the diffusion step. The boron silicide film is removed for the purpose of, for example, lowering the resistance of the electric contact to the boron diffusion layer 193, and the process therefor comprises selectively or entirely etching the boron silicide film 192. Because the boron silicide film 192 has a relatively high resistance, there are cases in which the removal thereof is requisite for achieving a contact of sufficiently low resistance. Thus, step B may comprise wet etching the boron silicide film 192 using a mixed solution of hydrofluoric acid and $HNO_3$.

In the final step C, a metallic film 194 is formed on the surface of boron diffusion layer 193 for use in creating a direct connection. Specific metals which may be used for metallic film 194 are, for example, Ti, Co, Mo, and W. Otherwise, polysilicon or amorphous silicon heavily doped with impurities may be used in place of metal film 194.

In a modified process, the removal step B may be divided into steps B1 and B2. Step B1 comprises converting boron silicide film 192 into a film 195 composed of a boron oxide and a silicon oxide. This step can be conducted by following the same procedure as explained with reference to FIG. 19. As described hereinbefore, the resulting film comprising a boron oxide and a silicon oxide is far inferior to boron silicide film in chemical and physical stabilities so that such film can be easily removed. More specifically, for example, the film comprising the oxides may be removed by wet etching using hydrofluoric acid in the subsequent step B2. Alternatively, dry etching may be conducted by applying accelerated particulates based on F or Cl instead of carrying out the steps B1 and B2 above.

Referring to FIG. 25, an eighth embodiment of a process of fabricating a semiconductor device according to the present invention is described below. In this embodiment, the impurity diffusion process is used for forming source/drain regions of a MOS transistor. The first step A comprises establishing an element isolation region 202 composed of a field oxide film formed by LOCOS oxidation on the surface of an N type Si substrate 201. Element isolation region 202 encloses and delimits an active device region in which there are formed a gate insulator film 203 and a gate electrode 204. The exposed surfaces of gate electrode 204 and gate insulator film 203 are further coated with an oxide film 205. After etching the oxide film 205 provided on the surface of the substrate intended for doping by treating with hydrofluoric acid, the wafer has the form shown for step A.

The wafer is then placed inside a high vacuum chamber to thereby undergo a cleaning treatment to remove an about 20 Å thick residual native oxide film from the surface of the N type Si substrate 201, to obtain a region having an active surface, i.e. between element isolation region 202 and the remaining oxide film 205.

In the same chamber as above, a step B which comprises depositing a boron film 206 on the entire surface of the substrate is conducted immediately after the removal of the native oxide film of step A. In the present embodiment, diborane ($B_2H_6$) gas at a partial pressure of $5 \times 10^{-5}$ Torr was introduced to the surface of the substrate and the substrate was being heated to 600° C. for a period of 2,000 seconds to deposit boron film 206. By this process, an adsorbed 500 Å thick boron film 206 was formed on the surface of the substrate. In general, this adsorption treatment is preferably conducted at a substrate temperature of 300° to 700° C.

The step C comprises converting the boron film 206 into a boron silicide film 207. This step can be conducted, for example, by annealing the boron film for 60 minutes in vacuum or in an inert gas atmosphere such as of nitrogen, while maintaining the substrate temperature to 800° C. In this manner, the boron film at the locations where it was adsorbed onto the active surface of the Si substrate 201 is selectively converted into boron silicide film 207. In this step, the boron atoms which have been thinly adsorbed on the element isolation region 202 and the oxide film 205 diffuse into the oxide because they are not in direct contact with the Si substrate 201. However, when they are thickly adsorbed, they remain adsorbed. This treatment for effecting a thermal reaction is preferably carried out in the temperature range of 700° to 1,000° C. and in an inert gas atmosphere free from oxygen and water to prevent oxidation from occurring.

The residual boron film 206 is selectively removed in the subsequent step D. This step can be conducted specifically be applying nitric acid to the surface of the substrate. Since boron silicide is insoluble in nitric acid, the boron silicide film 207 is left intact. In the case of fabricating a deep diffusion region, in the final step E, annealing is effected to form a source region 208 and a drain region 209 of an FET, using the boron silicide film 207 as the diffusion source.

The annealing temperature or the temperature for the thermal diffusion treatment is preferably set higher than that used for forming the boron silicide film in step C.

In the present embodiment, boron films can be selectively removed from unwanted regions other than the source region 208 and the drain region 209 which are both converted into boron silicide. In fact, boron atoms diffuse into the silicon substrate in step C, converting the boron film 206 into the boron silicide film so that the step E is not always necessary. It is possible to give the diffusion region a shallow depth compared to the thickness of the boron silicide film in the case where diffusion is performed only by step C.

A ninth embodiment according to the present invention is described below with reference to FIG. 26. Similar to the eighth embodiment, a source region and a drain region for an MOS transistor are formed using the impurity diffusion process according to the present invention. Step A comprises forming an element isolation region 212 defined by a field oxide film formed on the surface of an N type Si substrate 211. Region 212 surrounds and delimits an active device region. A gate electrode 214 is formed thereafter on a gate insulator film at the center of the active device region surrounded by the element isolation region 212. Then, after entirely covering the gate electrode 214 with an oxide film, that oxide film is removed from only the upper surface of the gate electrode 214 to establish a side wall 215. The side wall is utilized for realizing a so-called LDD structure. Then, the gate oxide film 213 on the surface of the Si substrate is etched to provide a source region and a drain region. Finally, the wafer is placed inside a vacuum chamber to remove the native oxide film from the surface of the source and drain regions to thereby expose an active surface on the Si substrate 211.

In the next step B, a boron film 216 is formed on the entire surface of the substrate 211. This step should be conducted immediately after step A, so that the exposed active surface obtained in step A may be utilized in step B. The deposition of the boron film 216 is effected in the same manner as in step B as described previously with reference to FIG. 25.

The boron film 216 thus obtained is then subjected to a thermal reaction treatment to obtain therefrom a boron silicide film 217 in step C. Film 217 is formed wherever film 216 is in contact with silicon. This step C is also similar to step C of FIG. 25. In the present embodiment, however, not only the boron film on the active region, but also that on the gate electrode 214 is reacted to give a boron silicide film. This occurs in the present embodiment because the boron film 216 is deposited on the gate electrode 214 in direct contact with the material constituting the gate electrode which contains silicon, for example polysilicon. It follows therefore that the silicon atoms react directly with boron atoms to form a boron silicide film.

However, the boron films which have formed on the side wall 215 and on the oxide film of element isolation region 212 do not undergo reaction to form a boron silicide film, because the side wall 215 and the oxide film of element isolation region 212 are not made of silicon. This signifies that only the boron film portions on the surface of gate electrode 214 and on the surface of source and drain regions 217 undergo selective reaction to create a boron silicide film.

In the step D, the unnecessary portions of boron film 216, such as the boron on side wall 215, are removed. If the boron film that was deposited in step B is sufficiently thin as to leave no residual boron films, then step D can be omitted. This step D can be carried out in the same manner as the step D described hereinbefore with reference to FIG. 25. It can be seen from the figure that a gate electrode 214 of reduced thickness is left between the gate insulator film 213 and the associated boron silicide film 217.

In the final step E, a source region 218 and a drain region 219 are formed by subjecting the resulting structure to annealing to allow boron atoms to diffuse from the portions of boron silicide film 217. Concurrently with the formation of the source and the drain regions, the gate electrode made from polysilicon is heavily doped with boron impurity to create a $p^+$ gate electrode 220.

The use of a composite film comprising a silicon oxynitride or silicon nitride film with an oxide film as the gate insulator film 213 effectively prevents boron from intruding into the substrate from the gate electrode 220 through the gate insulator film 213.

In the embodiment described above, boron was used as the P type impurity. The use of boron was preferred because it enables formation of a uniform boron silicide film on the surface of the silicon substrate. Accordingly, any other P type impurity may be used as well, provided that it provides a uniform silicide film on the surface of the Si substrate. Furthermore, not only P type impurities but also N type impurities such as phosphorus may be used to establish an N type impurity diffusion layer using a silicide as the solid diffusion source. Moreover, modifications may be made of the aforementioned embodiments without departing from the scope of the present invention.

The process for evaluating semiconductor devices, particularly the process for evaluating the film thickness of impurity films according to the present invention, will be described below.

Figure 27:
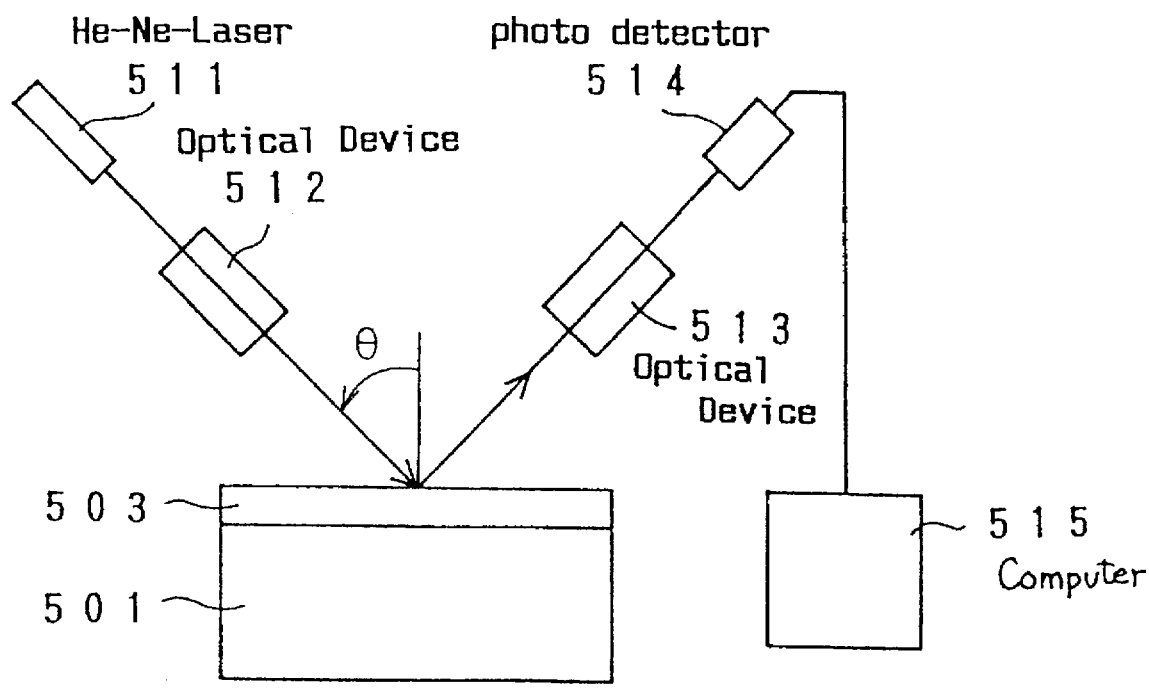
FIG. 27 is a pictorial diagram which illustrates a method for evaluating the film thickness of an impurity film according to a method of evaluating a semiconductor device according to the present invention.

FIG. 27 is a block diagram illustrating an apparatus and process for evaluating the film thickness of an impurity diffusion source. In the process, the thickness of a boron film 503 which was formed as an impurity diffusion source on the surface of an Si substrate 501 is evaluated. The process comprises irradiating boron film 503 with an incident beam from a light source, i.e. a helium neon (He—Ne) laser 511, at an angle of incidence θ to the surface of the boron film 503, and then detecting the reflected light with a photo detector 514. The incident light path and the reflection light path each contain a respective optical system 512 or 513 which controls the plane of polarization of light in the associated path. The physical arrangement of parts can be seen in FIG. 27.

The thickness of boron film 503 can be evaluated by observing the change in intensity of the polarized light component of the reflected light relative to the intensity of the incident light, which results from the change in refractive index which is a function of the film thickness. An apparatus for evaluating the film thickness based on polarization analysis is commercially available as an ellipsometer. In a practical ellipsometer, the incident light is converted into an elliptically polarized light using a quarter wavelength plate as the optical system 512, and the reflected light is then passed through an analyzer, i.e. the optical system 513, to obtain a linearly polarized light along the plane of polarization. The angle of rotation of the analyzer to give the minimum light intensity is automatically obtained, and the refractive index of the thin film and thereby the thickness thereof are calculated by means of a computer 515. This method is well established in the fabrication of semiconductors for evaluating the thickness of silicon oxide films and silicon nitride films.

The method using the above ellipsometer however, is not feasible for a thin film having a thickness of 200 Å or less because it is impossible in principle to measure the two parameters, i.e., the refractive index and the film thickness, of such thin films. Thus, in general, the refractive index is previously input into the computer as a given value to thereby accurately obtain the film thickness alone. However, unlike the case of a silicon dioxide film, the film thickness of boron films or films of boron silicon compounds cannot be obtained because the refractive indices thereof are unknown.

Figure 28:
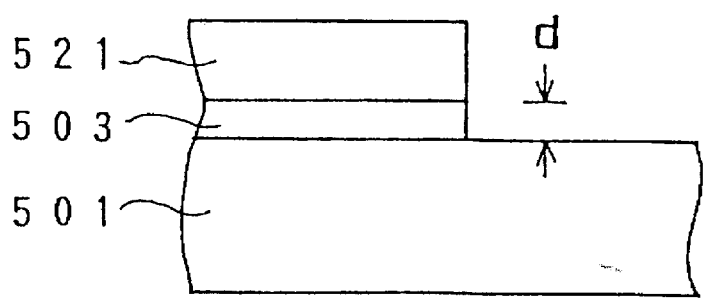
FIG. 28 is a cross sectional view of a sample illustrating the method for evaluating the film thickness of an impurity film according to the present invention.

Accordingly, the refractive index to be input into the ellipsometer was obtained as follows. The thickness of a boron film was measured first by a conventional mechanical means, and then the refractive index to yield the same thickness by calculation was determined. FIG. 28 shows a cross sectional view of a boron film sample the thickness of which is measured by a mechanical means. A boron film 503 deposited on the surface of a silicon substrate 501 was removed partially using a silicon oxide film sputtering film 521 as the mask, and the silicon oxide film 521 was selectively removed thereafter to leave the boron film having a step of a height difference of d. This height difference was measured by a mechanical means of a contact probe type to provide an indication of the film thickness.

Because the boron film 503 is chemically completely different from the silicon substrate 501, the boron film 503 can be selectively removed down to the surface of the silicon substrate 501. More specifically, the boron film can be easily oxidized at room temperature. That is, the boron film can be removed by first oxidizing it with nitric acid at about 80° C., and the oxide film can then be removed using hydrofluoric acid. When the boron film 503 is thick, the steps of nitric acid treatment and of hydrofluoric acid treatment can be conducted repeatedly to selectively remove the entire boron film from the silicon substrate.

Because a part of the masking film, i.e. the silicon oxide film 521, is also lost by the acid treatment processes, film 521 must be deposited to an initial thickness of 1 μm or more. After patterning the boron film 503, hydrofluoric acid is used to selectively remove the masking film 521. The boron film 503 remains intact during the etching with hydrofluoric acid, and the silicon substrate also is hardly consumed by this process. The film thickness to be lost by this treatment is not more than 10 Å.

Figure 29:
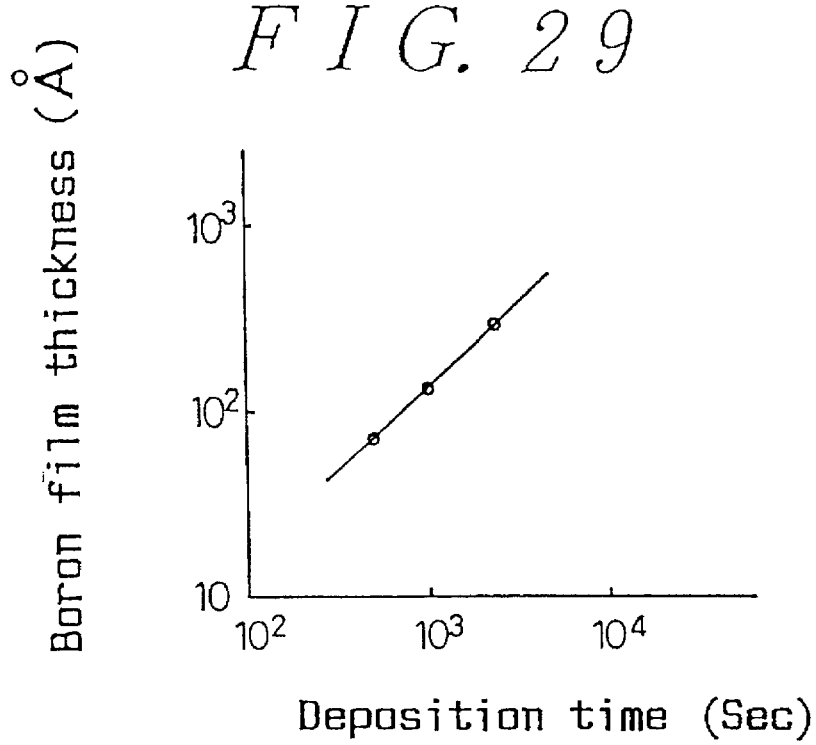
FIG. 29 is a graph which relates film thickness to duration of gas introduction, as obtained by the method of evaluating film thickness as shown in FIG. 28.
Figure 30:
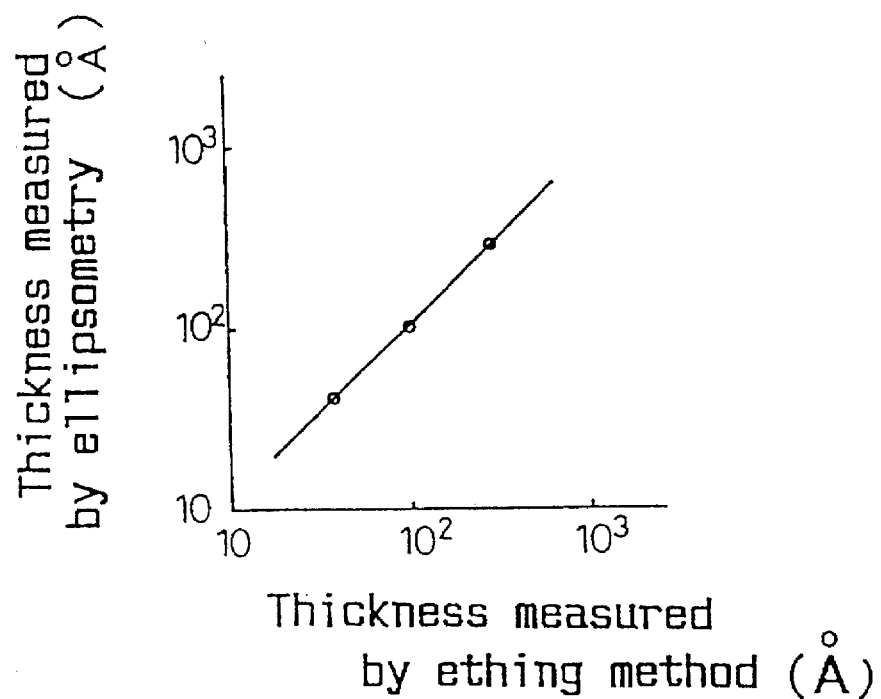
FIG. 30 is a graph which shows the correlation between film thickness obtained by a mechanical means and that obtained by an optical film thickness evaluation method according to the present invention.

The thickness of the boron film 503 was evaluated on the structure shown in FIG. 28, and the results are given in FIG. 29. The film thickness was obtained by assuming a linear relationship between the film thickness and the duration of introducing the diborane gas for depositing the boron film 503. The correlation between the film thickness obtained by an optical measurement using an ellipsometer and that obtained as shown in FIG. 29 by a mechanical means is given in FIG. 30. Refractive indices were selected for the same samples as used in the measurement for obtaining the results in FIG. 29, and the indices thus obtained were used for evaluating other samples of differing thickness. The results are shown in the graph of FIG. 30. Because the correlation between the thicknesses obtained by an ellipsometer and those by a mechanical means were found to be essentially 1:1, or 100%, the boron film can be assumed to have a uniform composition irrespective of the film thickness.

The facts that films of a constant composition are formed and that the boron films can be clearly distinguished from a silicon substrate by a sharp boundary have favored the evaluation using an optical means. In a practical production line, the refractive indices to be input into the ellipsometer need not be completely the same as shown in FIG. 30, but a provisional film thickness can be obtained by using the refractive index 1.45 for an oxide film as an input value.

The true film thickness can be derived from a provisional one by establishing the correlation factor between the film thickness obtained provisionally and that obtained mechanically. A provisional film thickness is first obtained with respect to a provisional refractive index to calculate therefrom the true film thickness. A correlation coefficient between the provisional film thickness and the film thickness measured by a mechanical means should be established preliminarily to carry out the subsequent film thickness evaluation using the ellipsometer alone. That is, the film thickness of a boron film can be evaluated using an ellipsometer without once obtaining the refractive index thereof.

FIG. 31 shows an apparatus for depositing boron films equipped with an optical means for evaluating the film thickness, i.e. an ellipsometer. A silicon wafer 533 having a boron film 534 formed on the surface thereof is mounted on a support 532 which is installed inside the apparatus 531 for depositing the boron film. The apparatus 531 for depositing the boron film is provided with transparent windows 538 and 539. A light beam is irradiated onto the surface of a silicon wafer 533 through the window 538 from a light source and optical system 535, e.g. a He—Ne laser, and the light reflected from the surface of silicon wafer 533 is introduced into an optical system and photo detector 536 via a transparent window 539 similar to window 538. The film thickness of the boron film 534 is automatically calculated by a computer 537 from an output from the photodetector 536 and an observed rotational angle of the optical system.

The apparatus 531 for depositing the boron film comprises a chamber which achieves a high vacuum of $10^{-6}$ Torr or higher. The boron film 534 is formed directly on the silicon substrate 533 without incorporating therebetween a native oxide film. Accordingly, the apparatus should be constructed with a high vacuum chamber in which no native oxide films can form. The film thickness of a boron film 534 on a sample is evaluated in a high vacuum by a non-contact method using a light beam. In a method using a probe or the like which is brought into contact with the sample, a space is necessary to mechanically work the probe inside the chamber. However, because the pressure inside the chamber is influenced by the external atmosphere that can communicate with the interior of the chamber via this space for working the probe, a high vacuum chamber is not feasible for an apparatus of this type.

It can therefore be seen that the non-contact measurement contemplated by the present invention has enabled the evaluation of the film thickness of a boron film inside a high vacuum chamber for the first time. The method above provides a real-time evaluation of the film thickness of a boron film being deposited inside the high vacuum chamber.

FIG. 32(a) is a graph which shows the growth of a boron film with the passage of time during introduction of diborane $(B_2H_6)$ into chamber 531. It can be seen therefrom that the film thickness can be evaluated on site with increasing time of introducing the gas. In general, the film deposition process is controlled so that a uniform thickness may be obtained without a large fluctuation from a predetermined film thickness.

In the apparatus for forming boron films equipped with an optical evaluation means as illustrated in FIG. 31, the film thickness is measured in real time so as to stop the introduction of diborane gas by a signal produced by the evaluation means upon detecting the achievement of a predetermined thickness. The film thickness as detected herein can be obtained from the output of the photo detector or by a computer calculation based on that output. Accordingly, an impurity film of a uniform thickness can be obtained by an apparatus in which the measured signal for the film thickness is fed back to a gas pressure control and the like to control the formation of the film. If the film thickness were to be calculated from an output of the photodetector, an additional computer must be provided in the apparatus.

FIG. 32(b) is a graph which shows the signal for the film thickness as obtained while depositing the film. In the graph, the abscissa represents the signal for the film thickness with progressive film deposition, and the ordinate represents the gas pressure of the diborane gas. The boron film grows with the introduction of gas along the direction indicated by arrows on the curve in FIG. 32(b). In obtaining a film 100 Å in thickness, for example, the gas pressure of diborane gas can be controlled to be brought to a value of zero upon confirming the achievement of the desired thickness from the output signal from the film thickness meter.

Thus, an apparatus for forming impurity films capable of producing films with excellent reproducibility and having less thickness fluctuation can be realized by feeding back the observed values from an optical thickness meter such as an ellipsometer to a means for controlling the growth of the impurity films. Since the light source of an optical thickness meter is a point source in principle, the thickness distribution within a wafer can also be evaluated by taking a plurality of points for the measurement.

Furthermore, the output from the optical film thickness meter, which is an electric signal, can be readily fed back to the gas pressure control or the temperature control for controlling the film growth. In the case of an ellipsometer, the optical detector is an opto-electric conversion element which easily produces electric signals in correspondence with the film thickness. It can be seen therefore that an automatic film deposition apparatus can be readily obtained.

FIG. 33 illustrates a process for controlling the film thickness for a film deposition system not equipped with an optical means for evaluating the film thickness. In this process, a wafer having a thin film of boron formed thereon is taken out from the chamber to evaluate the thickness of the boron thin film using an ellipsometer. The film thickness obtained in this manner is then compared with the specified and desired film thickness. Then, the wafer may be reinserted into the chamber to continue the film deposition in case it is still thin as compared with the targeted thickness, or may be etched to reduce the film thickness to the predetermined value. The film thus obtained with a desired thickness is then subjected to a diffusion process to allow boron to diffuse into the silicon substrate.

It can be seen that this process involves a thickness evaluation which requires that the wafer bearing the film be removed once from the high vacuum chamber. As described earlier herein, a boron film is so unstable that it easily undergoes oxidation even at a temperature as low as room temperature. Thus, the process just described exhibits poor precision in evaluating the film thickness. In contrast, the film thickness can be evaluated with a high precision under high vacuum by using an impurity film forming apparatus equipped with an optical means for film thickness evaluation.

In the foregoing, a description was given for a boron film as a specific example of a thin film for the impurity diffusion. It has been obtained from the experimental results of the present inventors that the optical film thickness evaluation above is applicable as well to thin films of boron silicon compounds. Since the thin film of a boron silicon compound (boron silicide) is obtained by reacting boron from the gas introduced into the vacuum chamber with silicon from the silicon substrate at a temperature higher than 600° C., and not by a simple deposition of boron on a silicon substrate as in the case of a boron film, the interface at the boundary between the boron silicide film and the silicon substrate moves into the substrate below the original surface (represented in several Figures herein by the reference numeral 119) which the silicon substrate had before the formation thereon of the boron silicide film. This phenomenon is similar to the case of forming a silicon oxide film on a silicon substrate by thermal oxidation thereof.

According to analyses conducted by the present inventors, the boron silicide film also was found to form with a uniform composition along the thickness direction of the film. A sharp interface was also observed to form between the silicon substrate and the boron silicide film. Thus, it follows that the evaluation using an optical means such as an ellipsometer is also effective in this case.

A boron silicide film is chemically more stable as compared with a boron film. Accordingly, additional means are needed for forming a sample with a structure as illustrated in FIG. 28. The procedure of forming a structure as shown in FIG. 28 followed by evaluating the thickness thereof with a mechanical means and then calculating a correction factor as to obtain the actual optical film thickness is the same as that taken for the evaluation of a boron film. In the case of a boron silicide film which is chemically more stable, however, the film may be subjected to repeated oxidation using nitric acid and etching using hydrofluoric acid to thereby selectively remove the boron silicide film alone from the silicon substrate to form a height difference therein. In practice, the silicon substrate was found to be etched by a mere 10 Å even after treatment was repeated about 10 times.

The boron film or the boron silicide film which was referred in the description above for the present invention, is formed by supplying diborane gas to the surface of the active silicon substrate from which a native oxide film is removed.

A chemically active surface of a silicon substrate having no native oxide film thereon cannot be obtained by a conventional simple treatment using hydrofluoric acid, because the boron film or the boron silicide film in the present process is formed by pyrolysis of diborane gas at a temperature as high as 400° C. or higher. In such a case, oxide films are easily formed at high temperatures of 400° C. or higher before the film of the desired composition is formed. Even in a case of not subjecting the structure to a high temperature treatment at 400° C. or higher, the surface of the silicon substrate is readily covered with an oxide film about 10 Å in thickness upon exposure of the surface to an atmosphere containing oxygen.

The growth rate of a boron film or a boron silicide film is considerably reduced by the presence of an oxide film merely about 10 Å in thickness. Accordingly, a step of removing the native oxide film or of maintaining the active surface of silicon substrate in a high vacuum chamber becomes requisite.

A boron film or a boron silicide film of about 200 Å in thickness is sufficient for forming an impurity diffusion region. In general, the film is formed at a thickness of about 100 Å. For example, an impurity diffusion layer about 10 Å in thickness is sufficient, by principle, to obtain a diffusion layer, or region, having an impurity concentration of about $10^{20}$ atoms/cm$^3$ and a depth of about 0.1 µm. A thin film suffices for the role of an impurity diffusion source, because a boron film is made of 100% boron, i.e. entirely of impurity atoms, and because a boron silicide film contains about 80%, atomic, or more boron (with from 5 to 20%, atomic, of silicon). Accordingly, a diffusion layer having less fluctuation in thickness can be obtained by measuring film thickness of about 100 Å using an optical means.

For incorporating impurities directly from a film containing 80% or more impurities into a silicon substrate by diffusion, an impurity film as thin as about 100 Å in thickness is used. Accordingly, not only an accurate evaluation of the film thickness but also a precise control of the film thickness can make possible the formation of a shallow diffusion layer 1 µm or less in thickness.

To make the optical evaluation of a boron film or a boron silicide film of the present invention feasible, the silicon substrate must be devoid of a surface native oxide film. This is not only due to the aforementioned reason that the growth of a boron film or a boron silicide film is delayed. For example, a precise measurement of the film thickness was unfeasible for a sample comprising a silicon substrate having about a 20 Å thick native oxide film and a thin boron film or boron silicide film about 100 Å in thickness formed thereon. This failure is ascribed to the presence of too many unknowns. Since the sample takes a multilayered structure consisting of a silicon layer, a silicon oxide layer, and a boron (or a boron silicide) layer, three unknowns must be determined. Then, the thickness of the boron film cannot be determined by ellipsometry.

It can be seen therefore that the formation of a boron film or a boron silicide film directly on a silicon substrate, with virtually no intervening native oxide layer, is a requisite for making an optical measurement feasible. Certainly, the optical constant, i.e. the refractive index, of a silicon oxide film is known, but since the film thickness is still unknown it makes the thickness evaluation of a boron film in a multilayered structure extremely difficult.

The above explanations for the present invention were made with reference to a method based on ellipsometry using an ellipsometer as an optical means for the evaluation.

However, the present invention is not limited only to ellipsometry. Furthermore, the foregoing Examples used a boron film or a boron silicide film as the impurity diffusion source. However, other impurity films may be employed as well, except for a film containing oxygen at a high concentration, for example a boron silicate glass (BSG) film in which segregation of impurities occur at the boundary between the silicon substrate and the glass film. The method according to the present invention cannot be applied to such a case because the distribution of the composition along the film thickness direction becomes nonuniform.

It has also been confirmed that the method for evaluating the film thickness of an impurity diffusion source according to the present invention is also applicable to a residual film obtained after the thermal diffusion step. That is, the thickness of the impurity film can be determined before and after the diffusion.

As explained hereinbefore, a boron film or a boron silicide film can be formed not on an oxide film but on a silicon substrate and on a silicon nitride film as well. Accordingly, the method is not limited only to applications involving silicon substrates. The evaluation can be conducted on a sample comprising a boron film on a silicon substrate having formed thereon a sufficiently thick silicon nitride film at a thickness 10 times or more greater than the boron film.

Specific semiconductor devices according to the present invention will be described below with reference to preferred embodiments illustrated in the following figures. First, the process for fabricating a boron silicide film for use in semiconductor devices according to the present invention will be described again referring to appropriate Figures.

FIG. 1 shows the structure and the process for fabrication of a simplest form of the semiconductor device of the present invention. In the step shown in FIG. 1A, an active surface of an N type silicon region 1 is exposed. More specifically, the native oxide film which covers the surface of the silicon region 1 is removed by, for example, heating the region in a vacuum, etching using a dilute hydrofluoric acid, or argon sputtering in vacuum. In the subsequent step corresponding to FIG. 1B, a boron silicide region is formed on the active surface using diborane ($B_2H_6$) as the boron containing gas. Silicon atoms in the silicon region 1 react directly with boron atoms or molecules containing boron to form therefrom a boron silicide film 2. In this step, the reaction proceeds simultaneously both upwardly and downwardly from the initial silicon region surface 119. In the next step of forming the boron silicide film 2, the temperature of the thermal treatment is set relatively high and the duration relatively long to thereby allow the boron atoms to diffuse from the boron silicide film into the silicon region 1 to form a boron diffusion region 3. In this manner, the boron diffusion region 3 can be formed simultaneously with the establishment of the boron silicide film 2.

The composition of the boron silicide film is shown in FIG. 4. In the graph of FIG. 4, the Si content by atomic percentage is taken along the ordinate and the heating temperature of the substrate or the film deposition temperature is taken along the abscissa. As is shown clearly in FIG. 4, the Si content depends on the film deposition temperature.

A chemically and physically stable diffusion source is obtained only when an Si content of a predetermined level or higher is achieved. Therefore, the film is deposited at a temperature of 700° C. or higher.

FIG. 9 summarizes the results obtained from experiments for testing the chemical stability of a boron silicide film. A boron silicide film as deposited was subjected to various types of chemical treatment using a plurality of chemicals before subjecting the film to the diffusion treatment. In FIG. 9, the types of chemical treatment applied to the sample are indicated along the abscissa, and the observed sheet resistivity $\rho_s$ of the diffusion layer after the diffusion treatment is indicated along the ordinate. The sheet resistivity of a chemically untreated sample is indicated by a broken line for comparison.

It can be seen therefrom that the sheet resistivity is somewhat increased for samples subjected to chemical treatments using nitric acid or hot nitric acid as compared to that for an untreated sample. However, the increase is small and hence it can be safely said that the influence of a chemical treatment on the sample is negligible. Conclusively, a boron silicide film can be said to be extremely stable against chemicals.

In FIG. 10 is shown the resistance of a boron film against chemicals to be compared with the results given in FIG. 9. The abscissa and the ordinate of FIG. 10 represent the same as quantities as FIG. 9. It can be seen that the sheet resistivity is somewhat increased for the samples which were subjected to each of the treatments with nitric acid, a mixture of sulfuric acid with aqueous hydrogen peroxide, and hydrofluoric acid. Particularly in the sample treated with hot nitric acid, the sheet resistivity is observed to soar up to 3 k$\Omega$/sq. The extremely high sheet resistivity is ascribed to dissolution of the boron film when treated with hot nitric acid, which made it impossible to sufficiently diffuse the boron atoms. Conclusively, boron films are inferior to boron silicide films with respect to chemical resistance.

Representative embodiments of the present invention are described in detail below with reference to FIGS. 34 to 40.

Figure 34:
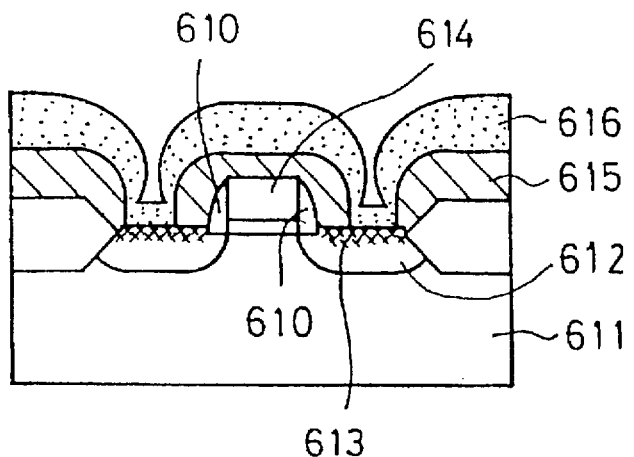
FIG. 34 is a cross sectional view of the structure of a MISFET constituting a semiconductor device according to the present invention, which comprises a boron silicide film on the surface of a source/drain region.

A P channel insulated gate field effect transistor (Metal Insulator Semiconductor Field Effect Transistor, which is abbreviated hereinafter as MISFET) is illustrated in FIG. 34 by its structural cross section and is described below as an embodiment of a semiconductor device according to the present invention. In the structure shown in FIG. 34, P type semiconductor regions 612 are formed on a part of the surface of an N type semiconductor region 611 to provide a source and a drain of the MISFET. The present embodiment is characterized in that boron silicide regions 613 is formed on the P type semiconductor region 612. The boron silicide regions 613 and the P type semiconductor regions 612 are formed by the procedure as shown in FIG. 1 and described earlier herein.

Further in this case, the process steps are designed such that the boron silicide regions will not remain on the N type polysilicon gate 614. The designing of the process steps is omitted from the present explanation because it is not the main part of the present invention.

Referring further to FIG. 34, the boron silicide regions 613 function effectively as a barrier against metal spikes in establishing an electric contact between the P type diffusion regions 612 and a metallic connection or connections 616 via openings in an interlayer insulator film 615. In the present embodiment, the gate electrode 614 is made of polysilicon, is disposed atop a gate insulation film and is provided with side wall insulation 610. However, it still is within the scope of the present invention that even a double layered electrode material comprising, for example, polysilicon and tungsten silicon can be used as the electrode material.

The structure as shown in FIG. 34 can be obtained by a process as illustrated in FIGS. 25. The depth of the P type semiconductor regions 612 can be shallow to a depletion layer width of these regions 612 because the boron silicide regions 613 function effectively as a barrier against metal spikes. Therefore, it is possible that the depth of the diffusion regions 612 is shallower than the thickness of the boron silicide regions 613.

The impurity concentration of the diffusion regions is at least less than the solid solubility of boron in silicon. The impurity concentration of the boron silicide regions 613 is at least more than the solid solubility of boron in silicon.

Figure 35:
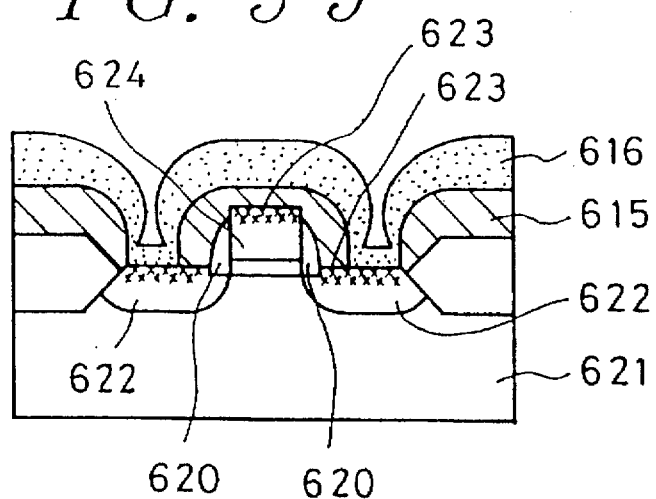
FIG. 35 is a cross sectional view of the structure of another MISFET constituting a semiconductor device according to the present invention, which comprises a boron silicide film on the surface of a source/drain region and of a gate electrode.

FIG. 35 shows a cross sectional structural view of a P channel MISFET having a P polysilicon gate 624 according to another embodiment of the present invention. Similar to the structure shown in FIG. 34, the MISFET of the present embodiment comprises P type semiconductor regions 622 and boron silicide regions 623 thereon on the surface of an N type semiconductor region 621. However, the MISFET of the present embodiment is characterized in that it additionally comprises a boron silicide region 623 on the P type polysilicon gate 624. In this embodiment, all of the boron silicide regions 623 are formed at one time.

In both FIGS. 34 and 35, no boron silicide but generally a BSG film is formed on the insulator film spacers 610 and 620. The semiconductor device as shown in FIG. 35 can be readily obtained by a fabrication process as illustrated in FIG. 26.

Figure 36:
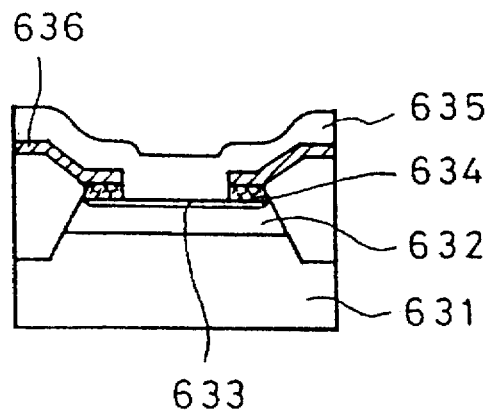
FIG. 36 is a cross sectional view of the structure of an NPN bipolar transistor constituting a semiconductor device according to the present invention, which comprises a boron silicide film on a part of the base region.

A third practical embodiment of the present invention is an NPN bipolar transistor whose structure is shown in the cross sectional view in FIG. 36. Referring to FIG. 36, an N type epitaxial region 632 is provided on an N type collector region 631, and a P type base region 633 and a boron silicide region 634 are formed thereon by the procedure as described in connection with FIG. 1. However, as a consequence of the patterning of a CVD insulator film 636 having an opening for forming an N type emitter region 635, the boron silicide region 634 obtained previously can be removed partially to give an arrangement as shown in FIG. 36. By providing a boron silicide region 634 between the P type base region 633 and the insulator film 636 in addition to a structure according to conventional technology comprising an insulator film 636 at the periphery of the electric junction of a P type base region 633 and an N type emitter region 635, a stable interface can be obtained between the surface of the base region 633 and the insulator film 636. As a consequence of this novel structure, a transistor characteristics with reduced noise is realized. By use of the method shown in FIGS. 1, P type base region 633 can be made very shallow, to a depth of 0.1 μm or less.

Figure 37:
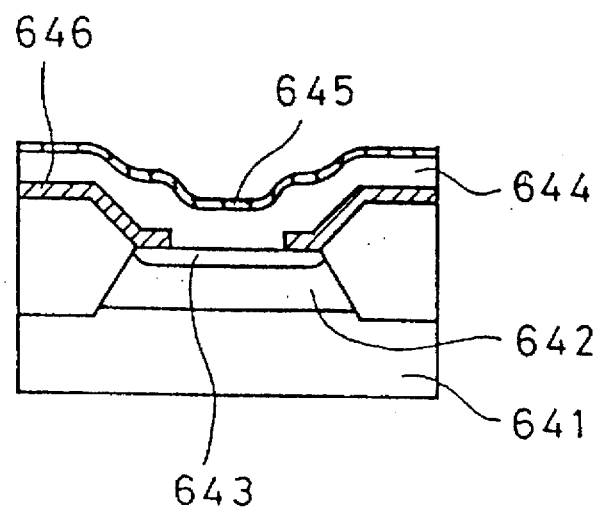
FIG. 37 is a cross sectional view of the structure of a PNP bipolar transistor constituting a semiconductor device according to the present invention, which comprises a boron silicide film on an emitter region.

Similarly, a cross sectional view of a PNP bipolar transistor constituting a fourth practical embodiment is illustrated in FIG. 37. The PNP bipolar transistor comprises a P type epitaxial region 642 on a P type collector region 641, and further thereon an N type base region 643. Furthermore, a P type emitter region 644 and a boron silicide region 645 are provided above an insulator film 646 disposed at the periphery of the aforementioned structure, film 646 being provided with an opening above base region 643. In this case again, the P type emitter region 644 and the boron silicide region 645 are established by following the procedure as described with reference to FIGS. 1.

As described above, an emitter having a boron silicide region 645 shows an improved resistance against metal spikes when making electric contact with a metallic connection.

Figure 38:
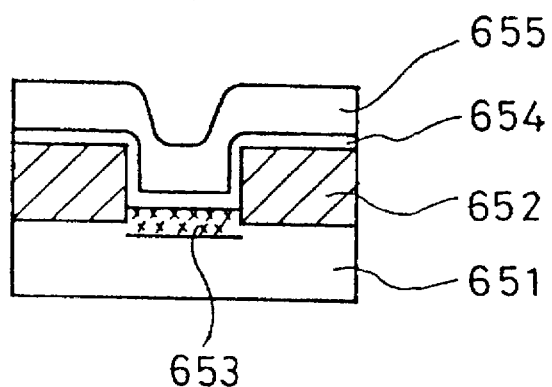
FIG. 38 is a cross sectional view of a contact structure in which tungsten silicide is connected to a semiconductor region incorporating therebetween a boron silicide film.

A fifth practical embodiment of a semiconductor device according to the present invention is illustrated in FIG. 38. Referring to FIG. 38, a boron silicide region 653 is provided between an impurity-doped semiconductor region 651 and a connection of a high melting metal compound 655 for establishing an electric contact therebetween. In a process which comprises providing, for example, a tungsten silicide film 655 as the connection of a high melting metal which can not be melted below 1000° C. on impurity-doped semiconductor region 651 via a patterned interlayer insulator film 652, in general, a semiconductor film 654 is formed under the tungsten silicide film 655 to improve the adhesion of the tungsten silicide film 655 to the base, and in particular to the interlayer insulator film 652.

In realizing such a structure, there often occurred an absorption of the dopant atoms inside the P type semiconductor film 654 during the fabrication steps thereof. As a consequence, the device suffered a problem of increased contact resistance due to this absorption of the dopants into the semiconductor film 654. With an aim to overcome the problem above in the present embodiment, the above mentioned process of impurity doping was used in forming a P type semiconductor region 651 in addition to the conventional structure, to thereby realize a structure having a boron silicide region 653 being formed at the same time with the formation of a P type semiconductor region 651. In this manner, compensation for the dopant atoms which are lost due to the phenomenon above can be performed by taking such a structure comprising a boron silicide region 653 containing a large amount of boron. Accordingly, the aforementioned problem which occurs during the fabrication process can be considerably reduced to realize a stable and a sufficiently low contact resistance.

Figure 39:
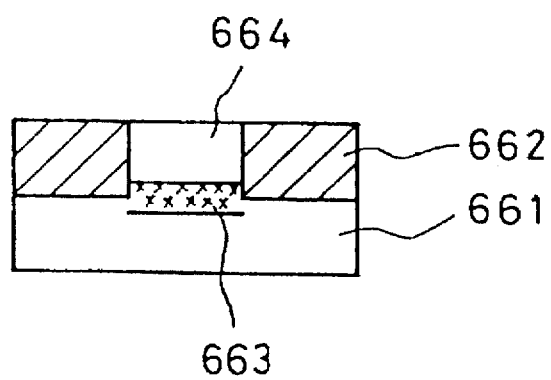
FIG. 39 is a cross sectional view of a contact structure in which tungsten is connected to a semiconductor region incorporating therebetween a boron silicide film.

Similar to the embodiments above, a sixth practical embodiment of a semiconductor device according to the present invention is illustrated in FIG. 39. Referring to FIG. 39, which shows a cross section of the structure, a boron silicide region 663 is provided between an impurity-doped semiconductor region 661 and a connection of a high melting metal 664 which can not be melted below 1000° C. for establishing an electric contact therebetween. In FIG. 39 is shown a structure comprising a P type semiconductor region 661 and a tungsten region 664 being connected electrically, with a patterned interlayer insulator film 662 being incorporated therebetween. The boron silicide region 663 in this structure performs a function of stabilizing the interface between the tungsten 664 and the semiconductor region 661.

Figure 40:
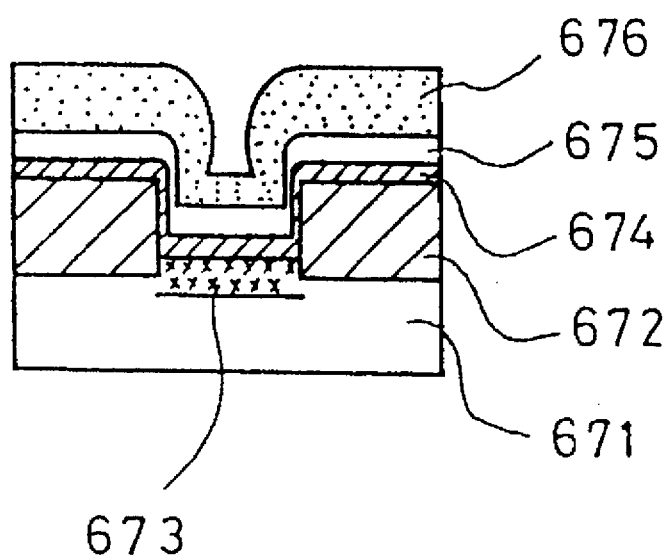
FIG. 40 is a cross sectional view of a contact structure in which a metallic connection having a barrier metal is connected to a semiconductor region incorporating therebetween a boron silicide film.

As a similar seventh practical embodiment of a semiconductor device according to the present invention, a structural cross section comprising a contact having a barrier metal is given in FIG. 40. In this case, the connection may comprise, for example, a structure comprising a titanium film 674 and a titanium nitride film 675 as the barrier metal, or the connection itself may be a metal wiring connection 676 comprising, for example, aluminum, silicon, or copper, and it may be integrated with the barrier metals above to give a layered structure of the barrier metals with Al—Si—Cu.

In the structure illustrated in FIG. 40, a metallic connection comprising a barrier metal is electrically connected with a P type semiconductor region 671 having a boron silicide region 673 with a patterned interlayer insulator film 672 being formed above region 671 to surround region 673. A contact structure of this type yields a particularly improved resistance against metal spikes and electromigration even when a shallow impurity diffusion layer is provided in the semiconductor region 671.

As described in the foregoing, the process for fabricating a semiconductor according to the present invention is a diffusion process which comprises utilizing a boron silicide film as the solid phase diffusion source for introducing directly the boron impurity inside the silicon layer. Accordingly, the process is effective for forming an impurity diffusion layer having a high surface concentration and a shallow junction. Accordingly, the process is effective for realizing a higher density and higher degree of integration of semiconductor elements. Furthermore, the boron silicide film for use as the solid phase diffusion source is chemically and physically stable that it allows a diversification of the fabrication processes for semiconductors and an increased freedom for the process design.

The method for evaluating an impurity film according to an evaluation method of the present invention comprises irradiating a light beam onto the surface of the impurity film, measuring the change in intensity of the reflected light, and evaluating the film thickness from the measured value and from the effective refractive index. Accordingly, the method is advantageous in that it is a rapid method which provides the film thickness automatically by a non-contact measurement. Furthermore, the use of an apparatus for fabricating an impurity film comprising a vacuum chamber to directly form the impurity film therein, a means for irradiating a light beam inside the vacuum chamber, and an optical means for evaluating the film thickness from the reflected light is further effective for more precisely controlling the impurity film. In particular, the feedback of the optically obtained film thickness output signals for controlling gas pressure or temperature in forming the impurity film is further effective for obtaining impurity films with a more precisely controlled film thickness.

Furthermore, an impurity diffusion layer having less scattering can be obtained in the impurity doping process according to the present invention by forming an impurity film directly on a silicon substrate, optically measuring the impurity film, and then effecting diffusion after once confirming that the film has achieved a predetermined film thickness.

Furthermore, the semiconductor device comprising a layered structure of boron silicide with a semiconductor region having a shallow impurity-doped junction according to the present invention has, firstly, a substantial effect in producing high speed operating MISFETs with small dimensions and bipolar transistors ascribed to the shallow diffusion layer. Secondly, it provides numerous effects concerning reliability of the semiconductor device, such as prevention of metal spikes and improving resistance against electromigration at the contact portion.

This application relates to subject matter disclosed in Japanese Application number 4-129537, filed on Apr. 21, 1992, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A process for fabricating a semiconductor device comprising the steps of:

forming a silicon oxide layer on a silicon substrate;

removing a portion of the silicon oxide layer to expose an active silicon surface;

cleaning a surface of a silicon region, by procedure which includes heating a surface of the silicon region in a chamber at a temperature of 8500° C. or higher, evacuating a chamber at a background pressure of less than $5 \times 10^{-7}$ torr, and applying $H_2$ gas at a pressure of more than $1 \times 10^{-4}$ torr to expose an active silicon surface;

forming a boron film on the exposed active silicon surface and on at least part of the remaining silicon oxide layer by introducing $B_2H_6$ at the substrate temperature between 4000° C. and 6000° C.;

forming a boron silicide layer by heating the substrate temperature between 600° C. and 8500+ C. under an inert atmosphere to convert the boron film on the active silicon surface into boron silicide;

removing the boron film on the silicon oxide layer with nitric acid; and introducing boron into the silicon region from the boron silicide layer by heating at a temperature higher than the temperature used in said step of forming a boron silicide layer.

* * * * *